United States Patent
Sung et al.

(10) Patent No.: US 6,852,998 B2
(45) Date of Patent: Feb. 8, 2005

(54) THIN-FILM TRANSISTOR SUBSTRATE AND LIQUID CRYSTAL DISPLAY

(75) Inventors: Chae Gee Sung, Miyagi-ken (JP); Jo Gyoo Chul, Miyagi-ken (JP); Makoto Sasaki, Miyagi-ken (JP); Kazuyuki Arai, Miyagi-ken (JP)

(73) Assignee: LG Philips LCD Co., Ltd., Seoul (KR)

(*) Notice: Subject to any disclaimer, the term of this patent is extended or adjusted under 35 U.S.C. 154(b) by 0 days.

(21) Appl. No.: 10/385,377

(22) Filed: Mar. 7, 2003

(65) Prior Publication Data

US 2003/0164498 A1 Sep. 4, 2003

Related U.S. Application Data

(63) Continuation of application No. 09/526,150, filed on Mar. 15, 2000.

(30) Foreign Application Priority Data

Mar. 16, 1999 (JP) .............................. 11-071037
Jan. 21, 2000 (JP) ...................................... 2000-013500

(51) Int. Cl.⁷ ............................................. H01L 29/12
(52) U.S. Cl. .............................. 257/43; 257/59; 257/72
(58) Field of Search ................................ 257/43, 59, 72

(56) References Cited

U.S. PATENT DOCUMENTS 6,444,296 B1 * 9/2002 Sasaki et al. ............... 428/209

FOREIGN PATENT DOCUMENTS

JP 2000-77806 * 3/2000

* cited by examiner

*Primary Examiner*—Nathan J. Flynn
*Assistant Examiner*—Ahmed N. Sefer
(74) *Attorney, Agent, or Firm*—Brinks Hofer Gilson & Lione

(57) ABSTRACT

A source line is directly connected to a source terminal composed of indium zinc oxide in a thin-film transistor substrate. A gate line is directly connected to a gate terminal composed of indium zinc oxide. Alternatively, drain electrodes of thin-film transistors for switching a plurality of pixel electrodes are directly connected to pixel electrodes composed of indium zinc oxide. These configurations do not require a passivation film which is essential for conventional thin-film transistor substrates, and the resulting thin-film transistor substrate can be made by a reduced number of manufacturing steps.

5 Claims, 22 Drawing Sheets

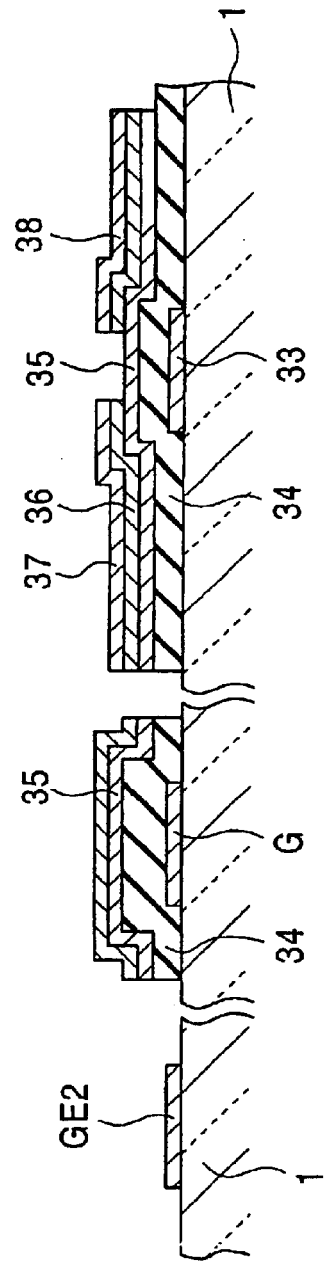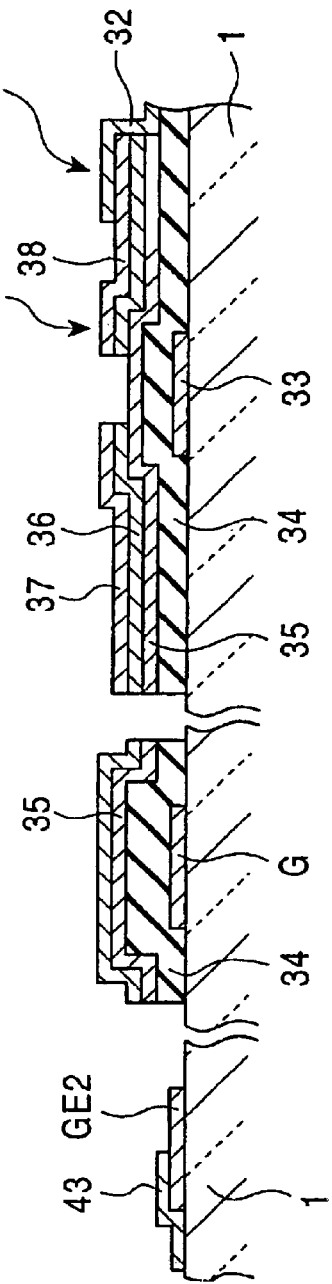

THIN-FILM TRANSISTOR SUBSTRATE AND LIQUID CRYSTAL DISPLAY

This application is a continuation of U.S. Nonprovisional application Ser. No. 09/526,150 filed on Mar. 15,2000, which is incorporated herein by reference in its entirety.

BACKGROUND OF THE INVENTION

1. Field of the Invention

The present invention relates to thin-film transistor substrates which are applicable to liquid crystal displays and relates to liquid crystal displays provided therewith. In particular, the present invention relates to a structure of a terminal or pixel electrode which is composed of indium tin zinc oxide or indium zinc oxide.

2. Description of the Related Art

FIG. 29 is a schematic plan view of a thin-film transistor array substrate of a typical thin-film transistor liquid crystal display. The thin-film transistor substrate is provided with top-gate thin-film transistors, gate lines, source lines, and pixel electrodes. FIGS. 30 and 31 are partial cross-sectional views of the thin-film transistor array substrate.

In this thin-film transistor array substrate, gate lines G and source lines S are arranged in a matrix on a transparent substrate 100. Regions surrounded by the gate lines G and the source lines S constitute pixel regions. Each pixel region is provided with a pixel electrode 101.

An island of a semiconductor film 102 composed of n$^+$ polysilicon or amorphous silicon is formed on the transparent substrate 100 at a corner of each pixel region. A gate insulating film 103 (refer to FIGS. 30 and 31) is formed so as to cover the semiconductor film 102 and the transparent substrate 100. The gate line G is formed on the gate insulating film 103 and a gate electrode 105 extends from the gate line G toward the center of the semiconductor film 102. A channel section 102a of the semiconductor film 102 opposes the gate electrode 105 and is separated therefrom by the gate insulating film 103.

An upper insulating film 106 is formed to cover the gate insulating film 103, the gate line G, and the gate electrode 105, and the source line S is formed on the upper insulating film 106. A source electrode 107 extends from the source line S and is connected to one end of the semiconductor film 102 via a contact hole 108 which is formed in the gate insulating film 103 and the upper insulating film 106. Another contact hole 109 is formed in the gate insulating film 103 and the upper insulating film 106 at the other end of the semiconductor film 102. A drain electrode 110 is formed on the upper insulating film 106 and is connected to the other end of the semiconductor film 102 via the contact hole 109.

A passivation film 111 composed of an insulating film is formed to cover the source electrode 107, the drain electrode 110, and the upper insulating film 106. The pixel electrode 101 is formed on the passivation film 111 and is connected to the drain electrode 110 via a contact hole 112 formed in the passivation film 111. A pad terminal 115 is formed on the passivation film 111 at one end of the source line S and is connected to the end of the source line S via a contact hole 113 formed in the passivation film 111. A thin-film transistor T6 is thereby formed as shown in FIG. 30.

Manufacturing steps of the top-gate thin-film transistor array substrate will now be described with reference to FIGS. 32 to 37.

A polysilicon semiconductor film and a SiO$_2$ underlying insulating layer are deposited on the transparent substrate 100 of glass etc. These layers are patterned by a photolithographic process to form an island of semiconductor film 120 and underlying gate insulating film 121, as shown in FIG. 32.

Next, a gate insulating film and an electrode film for forming a gate electrode are deposited thereon, and are patterned by a photolithographic process to form a gate insulating film 122 and a gate electrode 123.

With reference to FIG. 34, both ends of the semiconductor film 120 are subjected to ion doping and are then covered with an insulating interlayer 125. Contact holes 126 and 127 are formed in the insulating interlayer 125 at the both ends of the semiconductor film 120. With reference to FIG. 35, a source electrode 128 is formed on the insulating interlayer 125 and is connected to one end of the semiconductor film 120 via the contact hole 126, whereas a drain electrode 129 is formed on the insulating interlayer 125 and is connected to the other end of the semiconductor film 120 via the contact hole 127.

With reference to FIG. 36, an insulating film is formed as a passivation film 130 thereon. A contact hole 131 reaching the source electrode 128 and a contact hole 132 reaching the drain electrode 129 are formed in the passivation film 130.

With reference to FIG. 37, an ITO (indium tin oxide) pixel electrode 133 is formed on the passivation film 130 and is connected to the drain electrode 129 via the contact hole 132, whereas an ITO terminal electrode 135 is formed on the passivation film 130 and is connected to the source electrode 128 via the contact hole 131. A top-gate thin-film transistor T7 is thereby formed. This top-gate thin-film transistor T7 has substantially the same structure as that of the thin-film transistor T6.

In the top-gate thin-film transistor T7 shown in FIG. 37, the contact holes 131 and 132 are formed in the passivation film 130 in order to connect the pixel electrode 133 to the drain electrode 129 and to connect the terminal electrode 135 to the source line S. Such a configuration requires a photolithographic process for forming the contact holes, including an exposure step, a dry etching step, a stripping step, and a cleaning step. The thin-film transistor T6 shown in FIGS. 29 to 31 also has the same problem.

The reason why the pixel electrode 133 is provided after forming the passivation film 130 will now be described.

If the ITO pixel electrode 133 is directly connected to the drain electrode 129 without forming the passivation film 130, the source electrode 128 and the drain electrode 129 must be immersed into an etching solution (HCl:HNO$_3$:H$_2$O=1:0.08:1) for etching the ITO during the photolithographic patterning step of the ITO pixel electrode 133. Thus, the source electrode 128 and the drain electrode 129 will also be undesirably etched by the etching solution.

In order to avoid such an undesirable etching, the source electrode 128 and the drain electrode 129 are covered with the passivation film 130, and the ITO transparent conductive film is formed and then patterned to form the pixel electrode 133 and the terminal electrode 135. That is, such a configuration unavoidably requires the passivation film 130 and thus requires a series of steps for forming and patterning the passivation film 130.

SUMMARY OF THE INVENTION

It is an object of the present invention to provide a thin-film transistor substrate which does not require a passivation film and steps for forming contact holes in the passivation film and can be produced via a reduced number of manufacturing steps.

It is another object of the present invention to provide a liquid crystal display including such a thin-film transistor.

According to a first aspect of the present invention, a thin-film transistor substrate comprises a source line and a source terminal comprising one of indium tin zinc oxide and indium zinc oxide, wherein the source line is directly connected to the source terminal.

Since the source line is directly connected to the source terminal, this thin-film transistor substrate does not require an insulating film such as a passivation film which is necessarily formed on a source line in conventional thin-film transistor substrates. As a result, steps for forming the insulating film and for forming a contact hole in the insulating film can be omitted. Thus, the process for manufacturing the thin-film transistor substrate can be simplified.

Preferably, the source line comprises any one selected from the group consisting of aluminum, copper, molybdenum, chromium, titanium, tantalum, tungsten, and alloys thereof. These materials are not damaged in a specific etching solution for forming the source terminal composed of indium tin zinc oxide or indium zinc oxide.

According to a second aspect of the present invention, a thin-film transistor substrate comprises a gate line and a gate terminal comprising one of indium tin zinc oxide and indium zinc oxide, wherein the gate line is directly connected to the gate terminal.

Since the source line is directly connected to the gate terminal, this thin-film transistor substrate does not require an insulating film such as a passivation film which is necessarily formed on a gate line in conventional thin-film transistor substrates. As a result, steps for forming the insulating film and for forming a contact hole in the insulating film can be omitted. Thus, the process for manufacturing the thin-film transistor substrate can be simplified.

Preferably, the gate line comprises any one selected from the group consisting of aluminum, copper, molybdenum, chromium, titanium, tantalum, tungsten, and alloys thereof. These materials are not damaged in a specific etching solution for forming the gate terminal composed of indium tin zinc oxide or indium zinc oxide.

According to a third aspect of the present invention, a thin-film transistor substrate comprises drain electrodes constituting thin-film transistors for switching a plurality of pixel electrodes and pixel electrodes comprising one of indium tin zinc oxide and indium zinc oxide, wherein each of the drain electrodes is directly connected to each of the pixel electrodes.

Since each of the drain electrodes is directly connected to each of the pixel electrodes, this thin-film transistor substrate does not require an insulating film such as a passivation film which is necessarily formed on drain electrodes in conventional thin-film transistor substrates. As a result, steps for forming the insulating film and for forming a contact hole in the insulating film can be omitted. Thus, the process for manufacturing the thin-film transistor substrate can be simplified.

Preferably, the drain electrodes comprise any one selected from the group consisting of aluminum, copper, molybdenum, chromium, titanium, tantalum, tungsten, and alloys thereof. These materials are not damaged in a specific etching solution for forming the pixel electrodes composed of indium tin zinc oxide or indium zinc oxide.

According to a fourth aspect of the present invention, a thin-film transistor substrate comprises a substrate which is insulating at least at the surface thereof; a plurality of gate lines and source lines in a matrix formed on the substrate; pixel electrodes provided in regions surrounded by the gate lines and the source lines; and thin-film transistors, each being connected to the corresponding pixel electrode, the corresponding gate line, and the corresponding source line and functioning as a switching element for the corresponding pixel electrode; wherein each gate line is directly connected to a gate terminal comprising one of indium tin zinc oxide and indium zinc oxide, each source line is directly connected to a source terminal comprising one of indium tin zinc oxide and indium zinc oxide; the pixel electrodes comprise one of indium tin zinc oxide and indium zinc oxide, and a drain electrode of each thin-film transistor is directly connected to the corresponding pixel electrode.

Each gate line is directly connected to a gate terminal comprising one of indium tin zinc oxide and indium zinc oxide, each source line is directly connected to a source terminal comprising one of indium tin zinc oxide and indium zinc oxide, and a drain electrode of each thin-film transistor is directly connected to the corresponding pixel electrode. This thin-film transistor substrate does not require insulating films such as passivation films which are necessarily formed on gate line, source lines, and drain electrodes in conventional thin-film transistor substrates. As a result, steps for forming the insulating film and for forming a contact hole in the insulating film can be omitted. Thus, the process for manufacturing the thin-film transistor substrate can be simplified.

In the present invention, the indium tin zinc oxide is preferably a compound oxide comprising indium oxide, tin oxide, and zinc oxide, the zinc content with respect to the total amount of zinc, indium, and tin is 1 atomic percent to 9 atomic percent, the atomic ratio of tin to zinc is at least 1, the tin content with respect to the total amount of zinc, indium, tin is 20 atomic percent or less, and the compound oxide exhibits at least partially crystallinity.

Such a specific indium tin zinc oxide forms an amorphous film in a deposition process. This amorphous film can be crystallized by annealing and thus, the resistance of the film can be reduced.

More preferably, the zinc content with respect to the total amount of zinc, indium, and tin is 2 atomic percent to 7 atomic percent, and the tin content with respect to the total amount of zinc, indium, and tin is 5 atomic percent to 10 atomic percent.

According to a fifth aspect of the present invention, a liquid crystal display comprises a pair of substrates and a liquid crystal held between the pair of substrates, one of the pair of substrates being the thin-film transistor substrate according to one of the first to fourth aspects.

Since this thin-film transistor substrate does not require passivation films as insulating films, steps for forming the insulating film and for forming a contact hole in the insulating film can be omitted. Thus, the process for manufacturing the liquid crystal display can be simplified.

BRIEF DESCRIPTION OF THE DRAWINGS

FIGS. 12A and 12B are cross-sectional views for illustrating steps subsequent to the step shown in FIG. 11 in which required portions of the metal film, the ohmic contact film and the gate insulating film are patterned in FIG. 12A, and the thin-film transistor having a pixel electrode and a terminal is formed in FIG. 12B;

DESCRIPTION OF THE PREFERRED EMBODIMENTS

Figure 1:
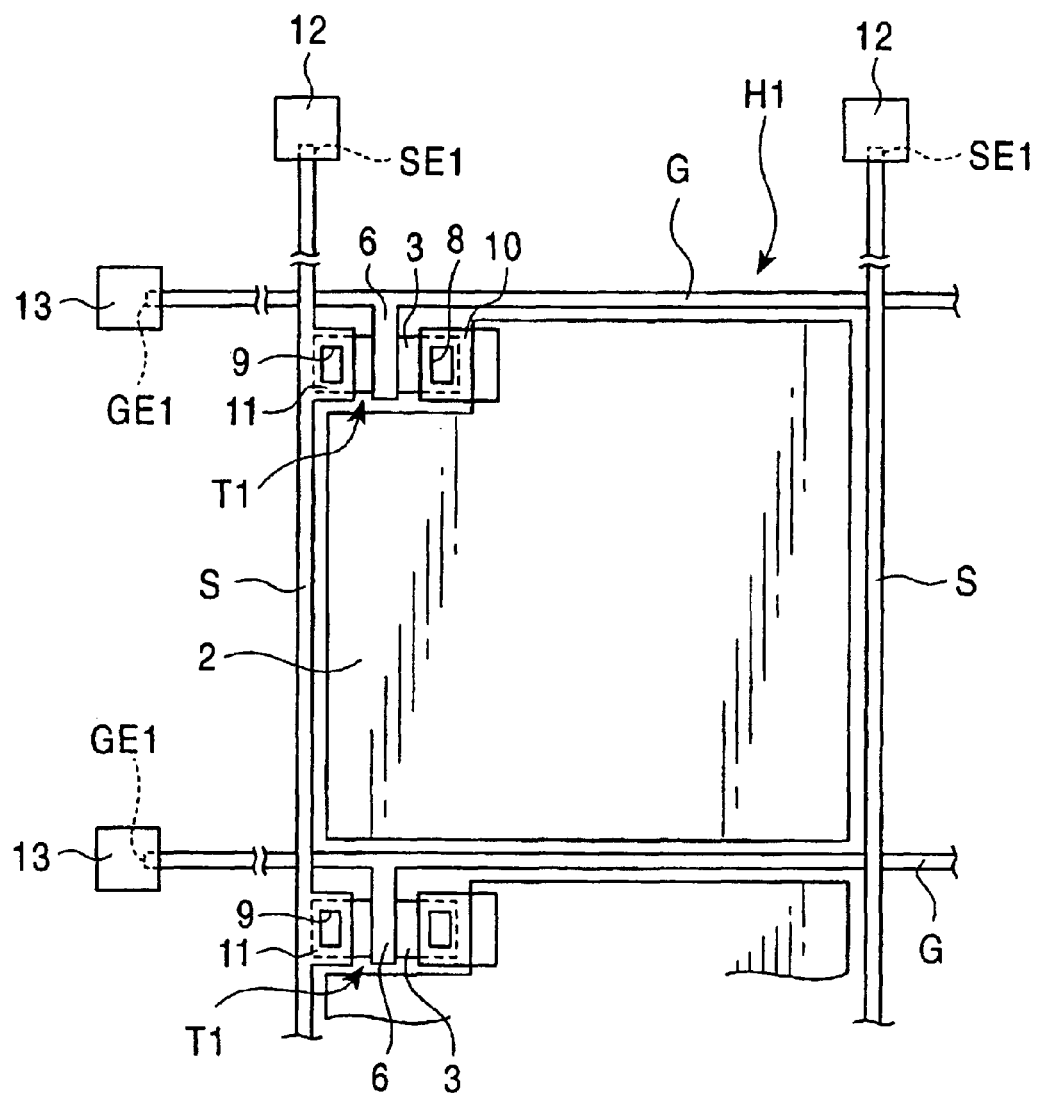
FIG. 1 is a schematic plan view of a thin-film transistor array substrate in accordance with a first embodiment of the present invention.
Figure 2:
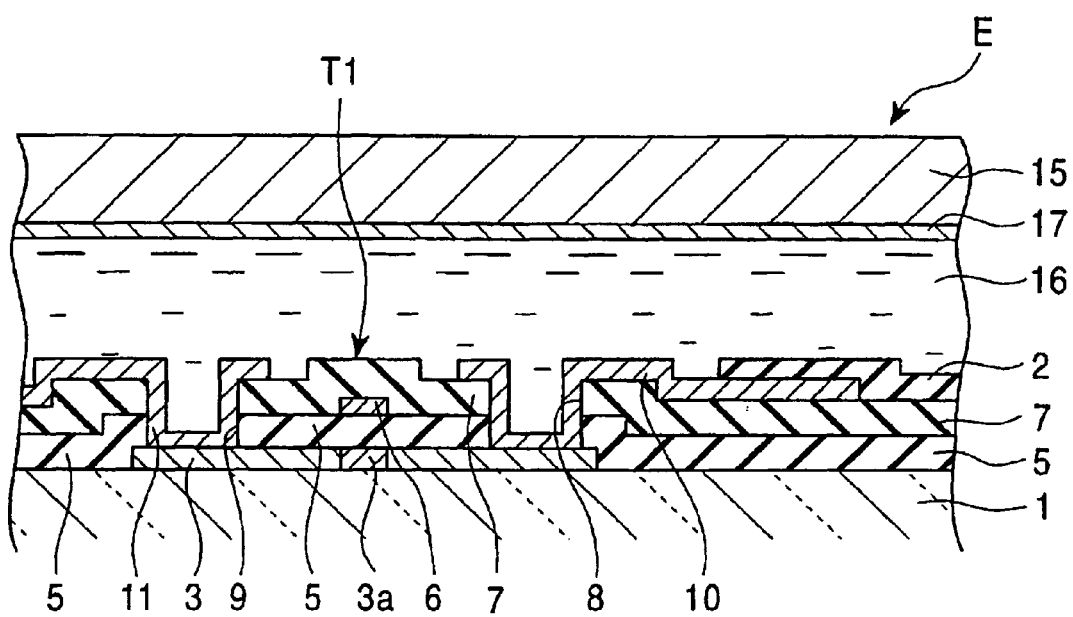
FIG. 2 is a cross-sectional view of the main section of the thin-film transistor array substrate shown in FIG. 1.
Figure 3:
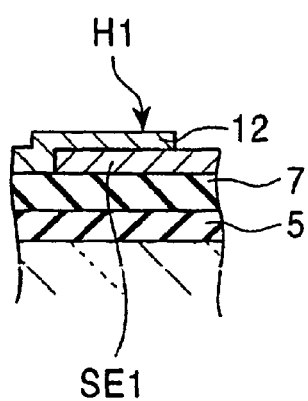
FIG. 3 is a cross-sectional view of part of the thin-film transistor array substrate shown in FIG. 1.

The preferred embodiments of the present invention will now be described in detail. It is understood that the embodiments are for the purpose of illustration only and are not intended as a definition of the limits of the invention.
First Embodiment FIG. 1 is a schematic plan view of a thin-film transistor array substrate H1 having a thin-film transistor T1 in accordance with a first embodiment of the present invention, FIG. 2 is a cross-sectional view of the main section of a liquid crystal display E provided with the thin-film transistor array substrate H1, and FIG. 3 is a cross-sectional view of part of the liquid crystal display.

In the thin-film transistor array substrate H1, a plurality of gate lines G and source lines S are formed in a matrix on a transparent substrate 1 composed of glass etc. Regions surrounded by the gate lines G and the source lines S constitute pixel regions. A pixel electrode 2 composed of a transparent conductive material, e.g., ITZO (indium tin zinc oxide) or IZO (indium zinc oxide), is provided above the transparent substrate 1 in each pixel region. A thin-film transistor T1 is provided at a corner of each pixel region.

The transparent substrate 1 is insulating at the surface thereof and may be transparent at required portions. For example, when the transparent substrate 1 is applied to the liquid crystal display E, the pixel regions which contribute to display must be transparent, and the other regions may be provided with a shading film such as a black matrix.

An island of an active semiconductor film 3 composed of polysilicon or amorphous silicon (a-Si) is formed on the transparent substrate 1 at the position of the thin-film transistor T1 at the corner of each pixel region. A lower gate insulating film 5 is deposited over the active semiconductor film 3 and the transparent substrate 1. A plurality of the gate lines G are formed in parallel on the lower gate insulating film 5, as shown in FIG. 1, and a rectangular gate electrode 6 extends from each gate line G toward the center of the active semiconductor film 3 in each pixel region. The active semiconductor film 3 has a channel section $3a$ and both ends of the channel section $3a$ are doped with ions.

An upper gate insulating film 7 is deposited over the lower gate insulating film 5, each gate line G, and each gate electrode 6. A contact hole 8 reaching one end (right end) of the active semiconductor film 3 and a contact hole 9 reaching the other end (left end) of the active semiconductor film 3 are provided in the upper gate insulating film 7 and the lower gate insulating film 5. A drain electrode 10 is formed over the active semiconductor film 3 at the right end, the contact hole 8, and the upper gate insulating film 7, whereas a source electrode 11 is formed over the active semiconductor film 3 at the left end, the contact hole 9, and the upper gate insulating film 7. Thus, the thin-film transistor T1 includes the active semiconductor film 3, the lower gate insulating film 5, the upper gate insulating film 7, the gate electrode 6, the drain electrode 10, and the source electrode 11.

The pixel electrode 2 is formed on the upper gate insulating film 7 in each region surrounded by the source lines S and the gate lines G. The pixel electrode 2 occupies most of the area of the pixel region, is in contact with the upper gate insulating film 7 in regions other than the regions of the source electrode 11, the active semiconductor film 3, and the gate electrode 6, and is in direct contact with the terminal end of the drain electrode 10.

Source terminals 12 of ITZO or IZO are deposited above the upper gate insulating film 7 so as to partially cover both ends SE1 (only upper ends are depicted in FIG. 1) of the source lines S. Also, gate terminals 13 of ITZO or IZO are deposited above the upper gate insulating film 7 so as to partially cover both ends GE1 (only left ends are depicted in FIG. 1) of the gate lines G.

Figure 29:
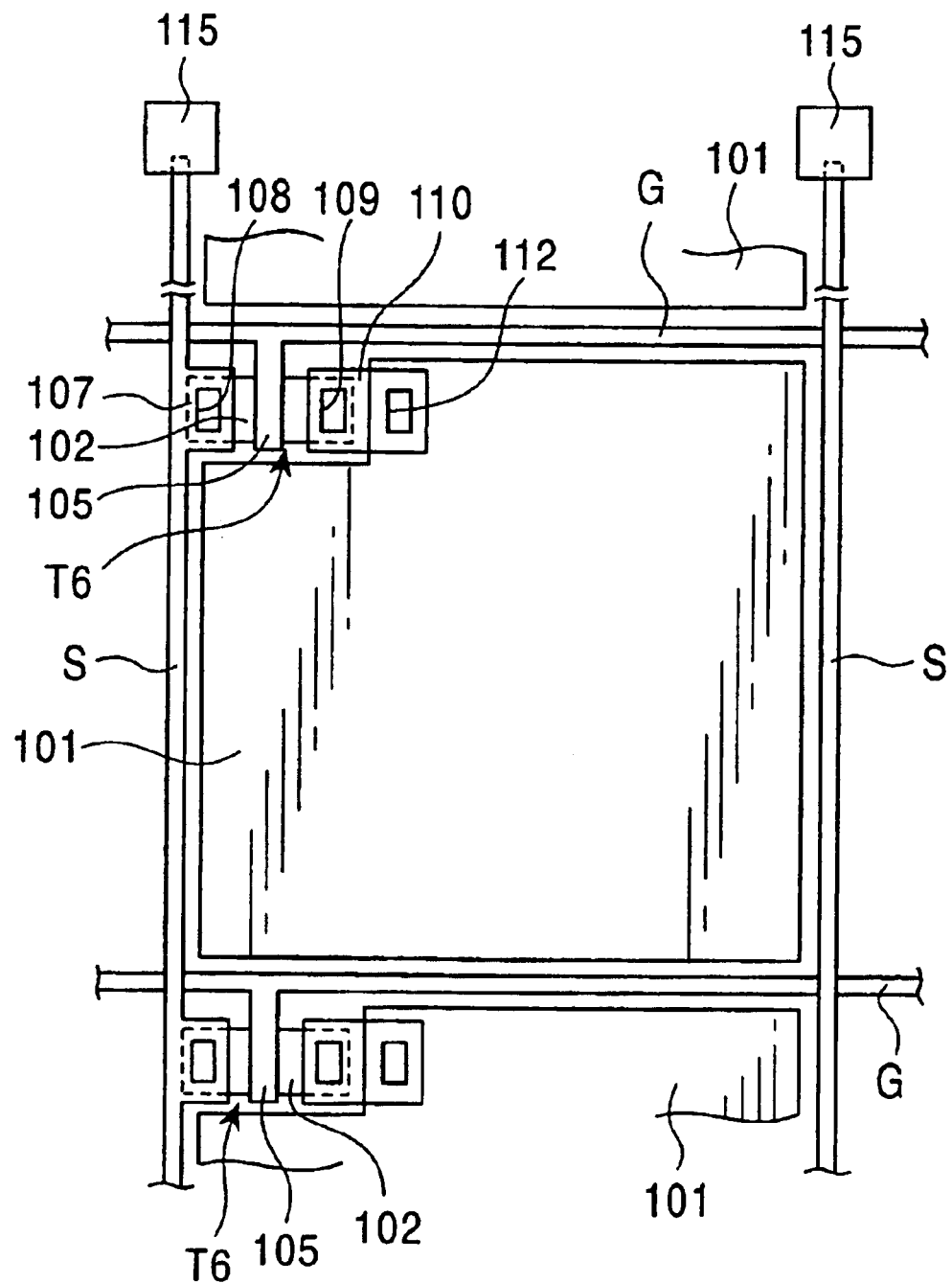
FIG. 29 is a schematic plan view of a conventional thin-film transistor substrate.
Figure 30:
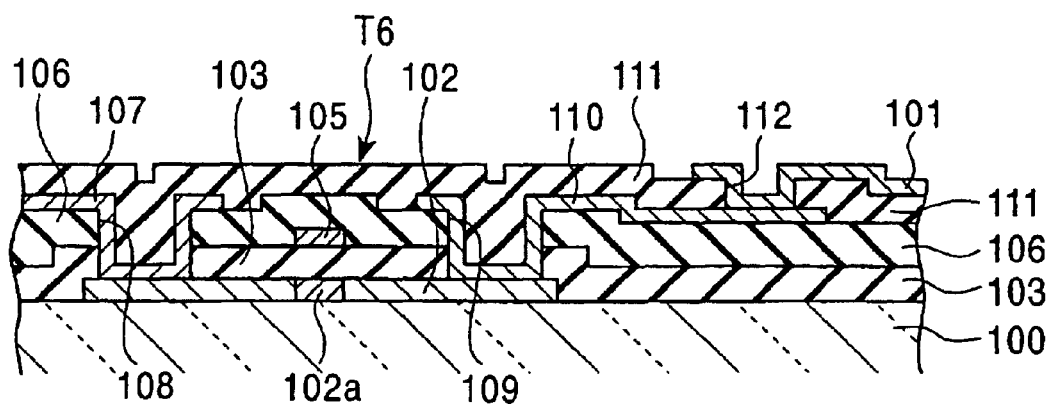
FIG. 30 is a cross-sectional view of the main section of the thin-film transistor substrate shown in FIG. 29.
Figure 31:
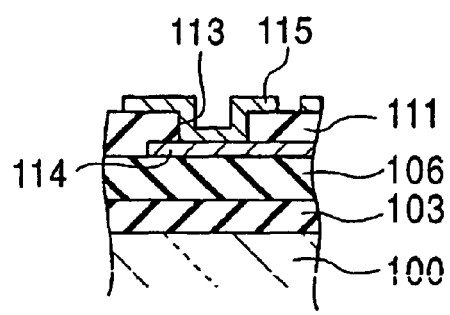
FIG. 31 is a cross-sectional view of part of the thin-film transistor substrate shown in FIG. 29.
Figure 32:
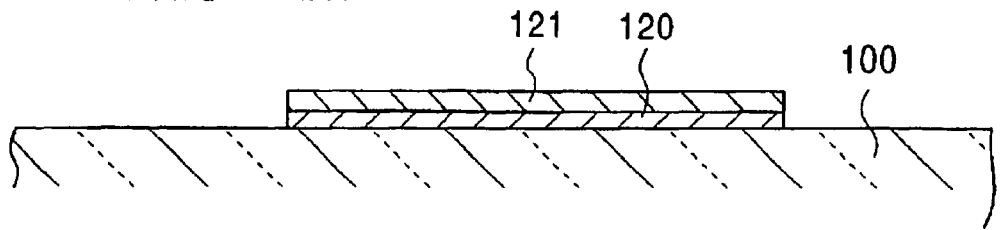
FIG. 32 is a cross-sectional view for illustrating a method for making a conventional thin-film transistor in which an island of a semiconductor film and a lower insulating film is formed on a substrate.
Figure 33:
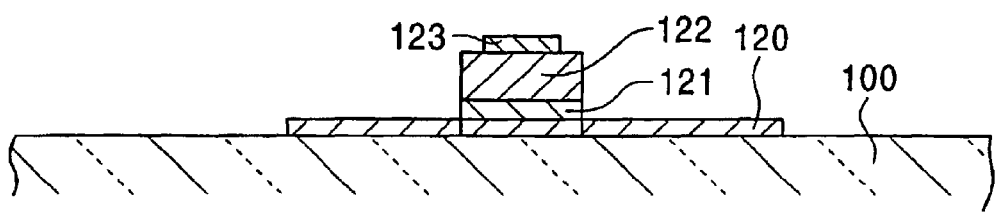
FIG. 33 is a cross-sectional view for illustrating a step subsequent to the step shown in FIG. 32 in which a gate insulating film and a gate electrode are formed on the lower gate insulating film.
Figure 34:
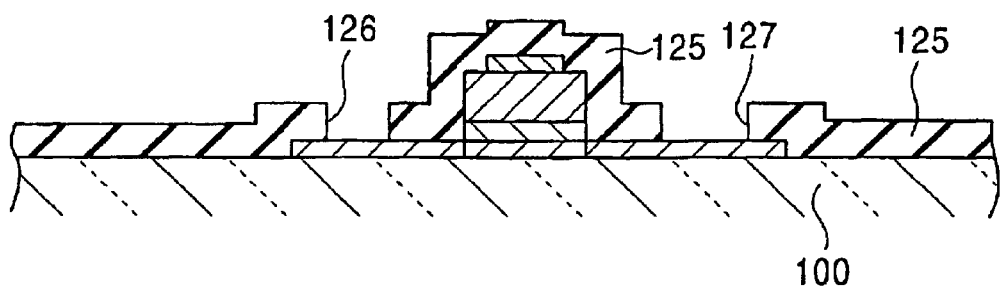
FIG. 34 is a cross-sectional view for illustrating a step subsequent to the step shown in FIG. 33 in which a source electrode and a drain electrode are formed.
Figure 35:
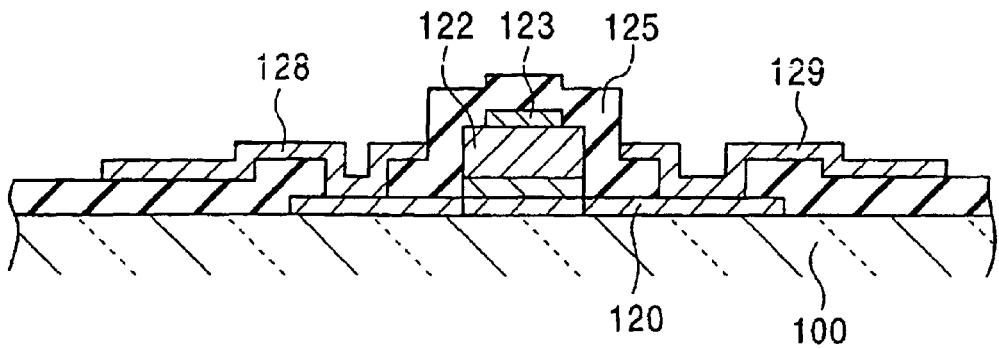
FIG. 35 is a cross-sectional view for illustrating a step subsequent to the step shown in FIG. 34 in which a passivation film is formed.
Figure 36:
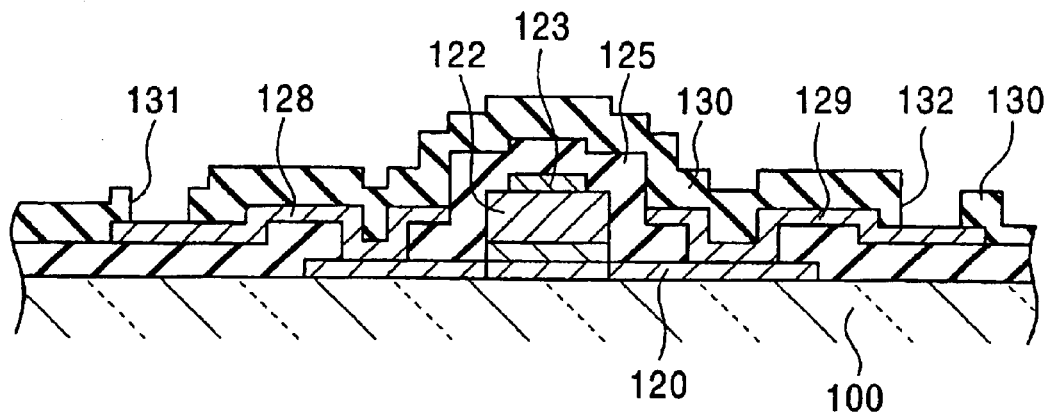
FIG. 36 is a cross-sectional view for illustrating a step subsequent to the step shown in FIG. 35 in which a contact hole is formed in the passivation film.
Figure 37:
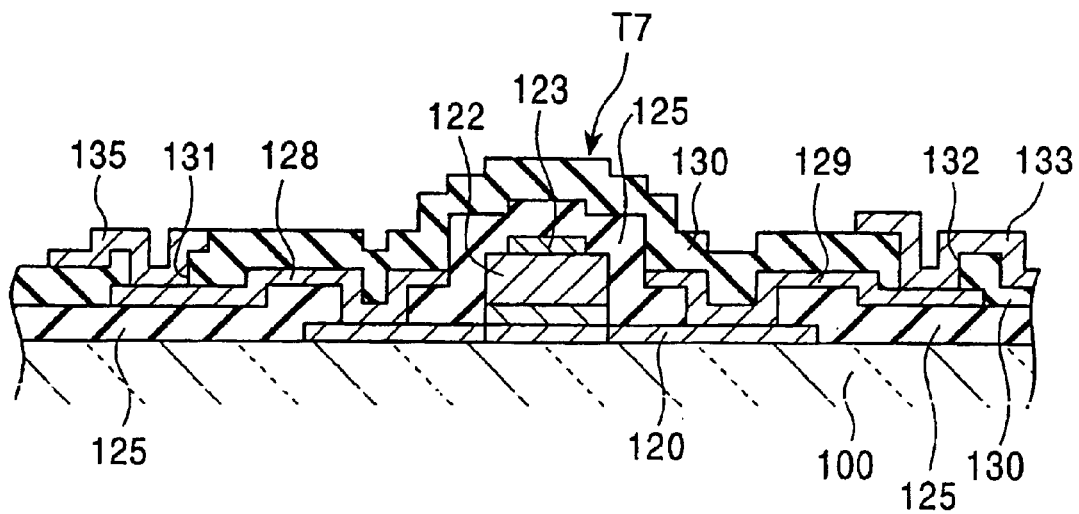
FIG. 37 is a cross-sectional view for illustrating a step subsequent to the step shown in FIG. 36 in which an ITO pixel electrode and a terminal electrode are formed.

In this embodiment, the pixel electrode 2 of ITZO or IZO is in direct contact with the upper gate insulating film 7 and the drain electrode 10, and a passivation film 111 shown in FIGS. 29 to 31 is not provided. Thus, steps for forming the passivation film 111 and steps for forming the contact holes 112, 108, and 113 are not necessary in this embodiment.

In the structure shown in FIGS. 1, 2, and 3, when the pixel electrode 2 is patterned by etching, the drain electrode 10 and the source electrode 11 are also immersed into an etching solution. An etching solution containing oxalic acid or hydrochloric acid does not damage the metallic material, which is the constituent of the drain electrode 10 and the source electrode 11, and can selectively etch the pixel electrode 2. Thus, the use of such an etching solution is preferable.

In the structure shown in FIGS. 1 to 3, a liquid crystal 16 is enclosed between the thin-film transistor array substrate H1 and a transparent counter substrate 15 to form a liquid crystal display. An electric field is applied to a common electrode 17 provided on the counter substrate 15 and the pixel electrode 2 to control the alignment of the liquid crystal enclosed in the corresponding pixel region.

The source terminals 12 and the gate terminals 13 are provided in the exterior of a sealant which encloses the liquid crystal 16, and are satisfactorily connected to terminals of driving LSIs, such as tape carrier packages.

With reference to FIGS. 4 to 8, a method for making a thin-film transistor array substrate having substantially the same structure as shown in FIGS. 1 to 3 will now be described.

Figure 4:
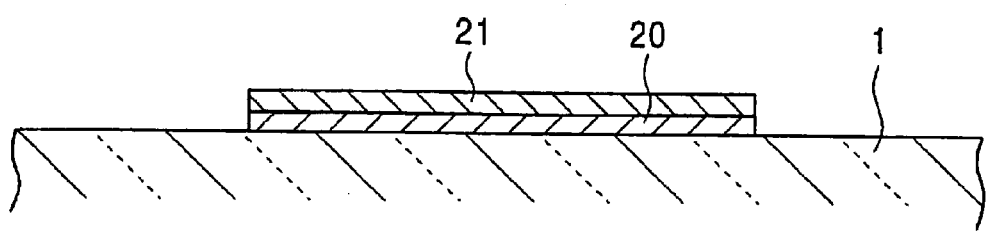
FIG. 4 is a cross-sectional view for illustrating a method for making the thin-film transistor array substrate shown in FIGS. 1 to 3 in which a gate insulating film and a gate electrode are deposited on a substrate.

A polysilicon or amorphous silicon semiconductor film and a $SiO_2$ underlying insulating layer are deposited on the transparent substrate 1 of glass etc. These layers are patterned by a photolithographic process to form an island of semiconductor film 20 and an underlying gate insulating film 21, as shown in FIG. 4.

Figure 5:
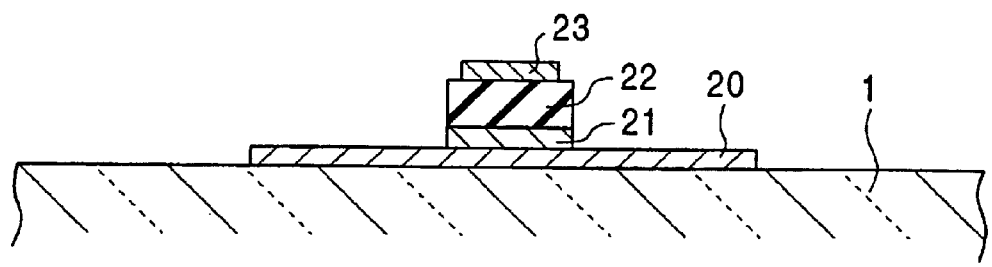
FIG. 5 is a cross-sectional view for illustrating a method for making the thin-film transistor array substrate shown in FIGS. 1 to 3 in which a semiconductor film and an insulating film are deposited on a substrate.

With reference to FIG. 5, a gate insulating film and an electrode film for forming a gate electrode are deposited thereon, and are patterned by a photolithographic process to form a gate insulating film 22 and a gate electrode 23.

Figure 6:
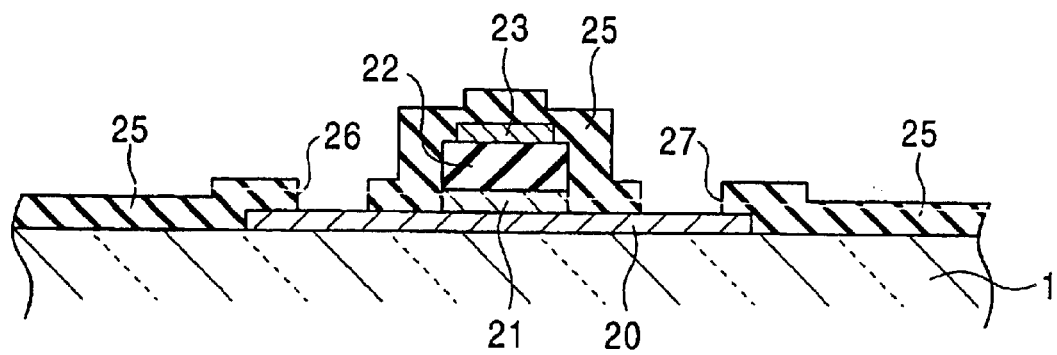
FIG. 6 is a cross-sectional view for illustrating a method for making the thin-film transistor array substrate shown in FIGS. 1 to 3 in which an insulating film is deposited on the substrate.
Figure 7:
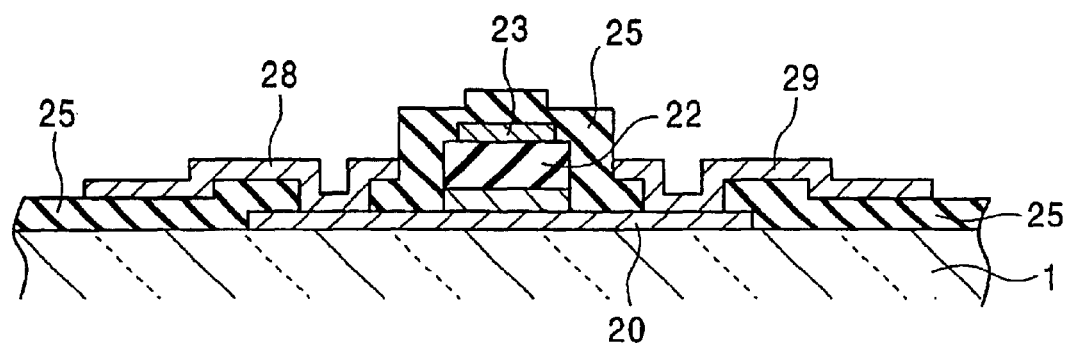
FIG. 7 is a cross-sectional view for illustrating a method for making the thin-film transistor array substrate shown in FIGS. 1 to 3 in which a contact hole is formed in the insulating film on the substrate, a source electrode and a drain electrode are connected to the semiconductor film.

With reference to FIG. 6, both ends of the semiconductor film 20 are subjected to ion doping and are then covered with an insulating interlayer 25. Contact holes 26 and 27 are formed in the insulating interlayer 25 at the both ends of the semiconductor film 20. With reference to FIG. 7, a source electrode 28 is formed on the insulating interlayer 25 and is connected to one end of the semiconductor film 20 via the contact hole 26, whereas a drain electrode 29 is formed on the insulating interlayer 25 and is connected to the other end of the semiconductor film 20 via the contact hole 27.

Figure 8:
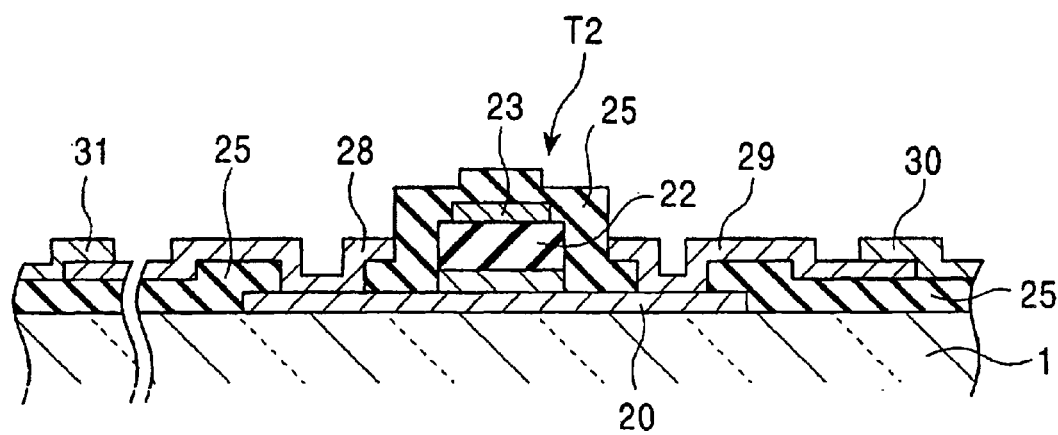
FIG. 8 is a cross-sectional view for illustrating a method for making the thin-film transistor array substrate shown in FIGS. 1 to 3 in which a source line is directly connected to a source terminal and a drain electrode is directly connected to a pixel electrode.

With reference to FIG. 8, an IZO or ITZO layer is deposited on the entire surface and is patterned by a photolithographic process to form a pixel electrode 30, a source terminal 31 at each of two ends of each source line S, and a gate terminal at each of two ends of each gate line G.

The IZO layer is composed of, for example, 90% of indium oxide ($InO_x$) and 10% of zinc oxide ($ZnO_x$). A preferable etching solution for etching the IZO layer contains oxalic acid ($(COOH)_2$) or hydrochloric acid (HCl). A preferable concentration of oxalic acid in the etching solution is, for example, 0.6 mole/liter, and a preferable concentration of hydrochloric acid in the etching solution is, for example, 3.5%. Other concentrations may be selected depending on the process.

The ITZO layer is, for example, a compound oxide layer primarily composed of indium oxide ($In_2O_3$), tin oxide ($SnO_2$), and zinc oxide (ZnO). The compound oxide layer may contain several atomic percent of impurities.

Since the ITZO layer is connected to other lines and conductors, tin must be contained in an amount which is larger than the amount of zinc at these connecting sections so that the ITZO layer is crystalline. For example, when other lines and conductors are connected to the surface of the ITZO layer, tin must be enriched with respect to zinc in the surface composition so that the surface ITZO layer has crystallinity.

Preferably, in the ITZO layer, the zinc content with respect to the total amount of zinc, indium, and tin is 1 atomic percent to 9 atomic percent, the atomic ratio of tin to zinc is at least 1, the tin content with respect to the total amount of zinc, indium, and tin is 20 atomic percent or less and more preferably 1 atomic percent to 20 atomic percent.

Moreover, the zinc content with respect to the total amount of zinc, indium, and tin is 2 atomic percent to 7 atomic percent, and the tin content with respect to the total amount of zinc, indium, and tin is 5 atomic percent to 10 atomic percent. In addition, the indium content with respect to the total amount of zinc, indium, and tin is 75 atomic percent to 98 atomic percent.

In the ITZO layer, indium oxide is the primary component. Excess indium which does not bond to oxygen in the compound oxide generates electron carriers and forms an oxygen-deficient conductive mechanism. Tin oxide as an additional component is important to generate electron carriers by activation of tetra-valent tin in the compound oxide. If the compound oxide is amorphous, divalent zinc in zinc oxide is not activated and does not function as an acceptor for electron carriers. Thus, the composition of the ITZO layer is determined in view of the balance between these properties.

When the ITZO layer is used in actual connection, the connecting sections of other lines and terminals are preferably crystalline. The ITZO layer having the above composition is amorphous when the layer is formed by a conventional process, and is readily crystallized by annealing at a temperature above the crystallization temperature, that is, generally at 180 to 300° C. The annealing temperature is determined by the withstanding temperature of the peripheral circuits and the substrates. In a liquid crystal panel, the preferable annealing temperature is in a range of 200 to 250° C. in view of the withstanding temperature of the peripheral circuits and the substrates.

The deposited amorphous ITZO layer exhibits a high contact resistance of approximately 41 Ω to conductors, such as a source line terminal, a gate line terminal, and a tape carrier package (TCP). When at least the surface (approximately 50 Å from the surface) of the ITZO layer is crystallized by annealing at the above annealing temperature, the surface which is connected to other conductors exhibits a low resistance of approximately 2.3 Ω. The annealing may be performed in any atmosphere, for example, air, nitrogen, a mixture of 20% hydrogen and 80% nitrogen, a mixture of 20% oxygen and 80% nitrogen, or vacuum. The crystallized oxide transparent conductive film is not reactive with moisture or oxygen in the air and can maintain such a low resistance over time.

The amorphous ITZO layer having the above composition can be readily etched in a weakly acidic solution, such as a diluted hydrochloric acid solution and an organic acid solution. Thus, the amorphous transparent oxide conductive film is patterned by etching to form lead lines, and then required portions such as connections are annealed to decrease resistance at the connections. Resistance of connections of microcircuits can be thereby reduced.

The ITZO layer having the above composition is formed on the insulating substrate by any deposition process, such as a sputtering process, and is annealed. A preferable target used in the deposition process is composed of a compound oxide containing indium oxide, tin oxide, and zinc oxide. The zinc content with respect to the total amount of zinc, indium, and tin is 1 atomic percent to 12 atomic percent, the atomic ratio of tin to zinc is at least 1, and the tin content with respect to the total amount of zinc, indium, and tin is 22 atomic percent or less. More preferably, the zinc content with respect to the total amount of zinc, indium, and tin is 2 atomic percent to 10 atomic percent, and the tin content with respect to the total amount of zinc, indium, and tin is 5 atomic percent to 12 atomic percent.

In the sputtering process, zinc and tin easily splash and are barely deposited onto the substrate. Thus, the target may contain excess amounts of zinc and tin compared to the final composition.

When an oxalic acid etching solution is used in the etching process, the source line S, the source electrode 28, and the drain electrode 29 can be formed of any metal of aluminum, copper, molybdenum, chromium, titanium, tantalum, and tungsten, or any alloy thereof. When a diluted hydrochloric acid etching solution is used in the etching process, the source line S, the source electrode 28, and the drain electrode 29 can be formed of any metal of copper, molybdenum, chromium, titanium, tantalum, and tungsten. In other words, aluminum is easily eroded with the diluted hydrochloric acid solution; hence, the use of aluminum in lines and electrodes is not preferable if the diluted hydrochloric acid solution is used. Any other weakly acidic solution, such as an organic acid solution, may also be used in the present invention.

When the ITZO layer is formed, connections to other layers and conductors must be formed by etching the ITZO layer in the amorphous state. The amorphous ITZO layer having the above composition can be etched with a weakly acidic solution, such as a diluted hydrochloric acid solution or an organic acid solution. Thus, side etching is suppressed, and the etching can form a microstructure.

After the ITZO layer is subjected to microetching to form pixel electrodes having a predetermined size, the remaining layer is annealed at a temperature above the crystallization temperature to crystallize the amorphous ITZO. Thus, the resistance of the remaining layer is decreased, and connections to the drain electrode and the terminal have low resistance.

Accordingly, microlines having low contact resistance can be formed by etching the amorphous ITZO layer and then crystallizing the remaining layer.

A thin-film transistor T2 having a cross-section shown in FIG. 8 is prepared by the above steps. The thin-film transistor T2 has substantially the same structure as that of the thin-film transistor T1, which is described above with reference to FIGS. 1 to 3. The pixel electrode 30 is directly connected to the drain electrode 29, the source terminal 31 is directly connected to the source line S, and the gate terminal 13 is directly connected to the gate line G. Thus, this thin-film transistor substrate does not require a passivation film, which is formed on the source and drain electrodes in conventional processes. As a result, the manufacturing process does not require a step for forming the passivation film and steps for forming contact holes in the passivation film including an exposure step, a dry etching step, a stripping step, and a cleaning step. Thus, the thin-film transistor substrate can be produced via a reduced number of manufacturing steps.

Second Embodiment

Figure 9:
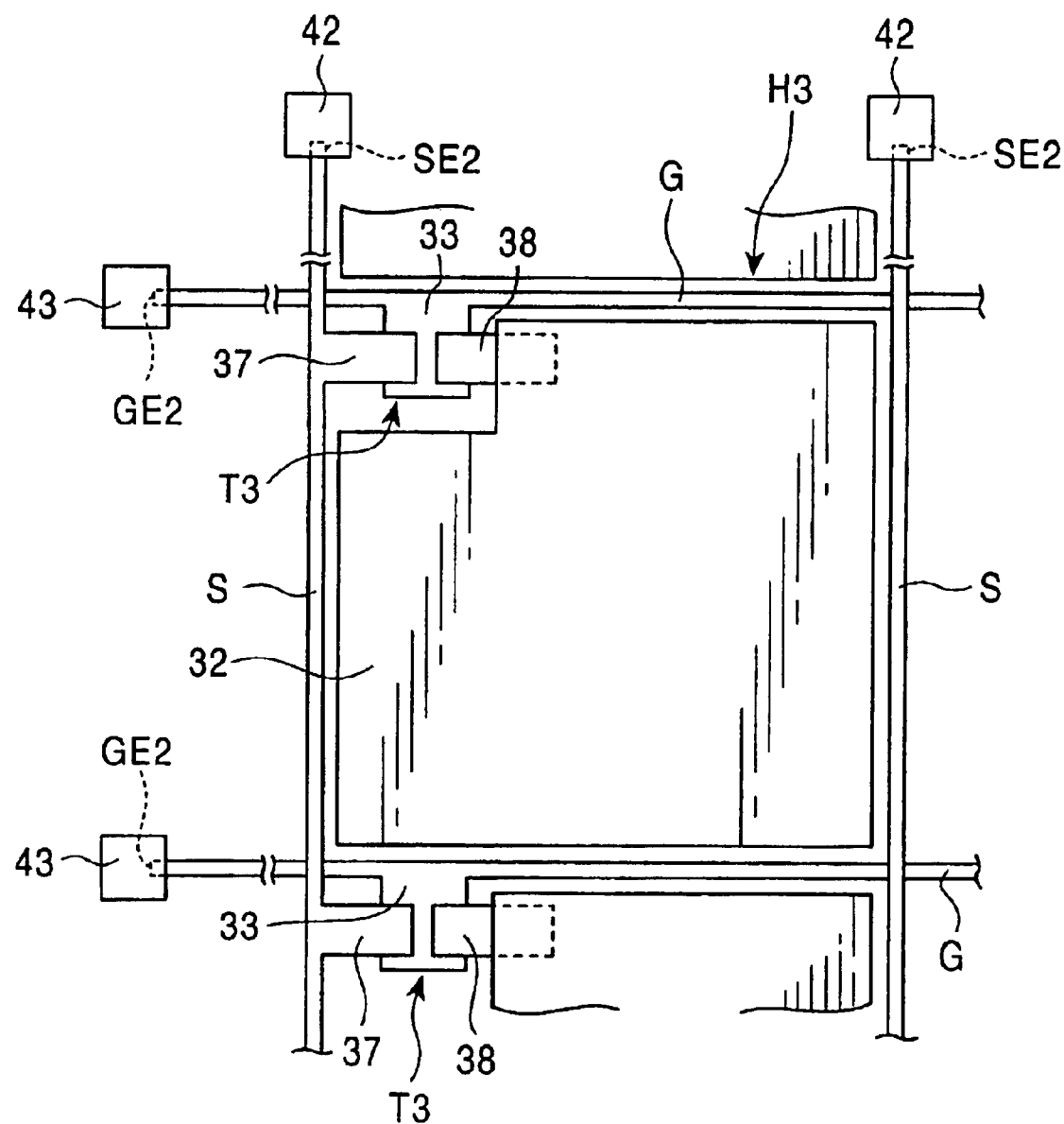
FIG. 9 is a schematic plan view of a thin-film transistor array substrate in accordance with a second embodiment.

FIG. 9 is a schematic plan view of a thin-film transistor array substrate H3 having a thin-film transistor T3 in accordance with a second embodiment of the present invention, and FIG. 12B is a cross-sectional view of the main section of a thin-film transistor section. When a liquid crystal display is formed using the thin-film transistor array substrate H3 having the thin-film transistor section shown in FIG. 12B, the thin-film transistor array substrate H3 is used together with a counter substrate (not shown in the drawing), and a liquid crystal is enclosed between these two substrates, as in the first embodiment.

In the thin-film transistor array substrate H3, a plurality of gate lines G and source lines S are formed in a matrix on a transparent substrate 1 composed of glass etc. Regions surrounded by the gate lines G and the source lines S constitute pixel regions. A pixel electrode 32 composed of a transparent conductive material, e.g., ITZO (indium tin zinc oxide) or IZO (indium zinc oxide), is provided above the transparent substrate 1 in each pixel region. A thin-film transistor T3 is provided at a corner of each pixel region.

With reference to FIG. 9, a rectangular gate electrode 33 is extracted from the gate line G at a corner for forming a thin-film transistor of each pixel region on the transparent substrate. With reference to FIG. 12B, a gate insulating film 34 is formed to cover the gate line G and the gate electrode 33. An island of an active semiconductor film 35 composed of polysilicon or amorphous silicon (a-Si) is formed on the gate insulating film 34 so as to cross the gate electrode 33. An ohmic contact layer 36 composed of amorphous silicon doped with an n-type dopant such as phosphorus (a-Si:n$^+$) is deposited thereon. A source electrode 37 is deposited on the ohmic contact layer 36 at one end of the active semiconductor film 35, whereas a drain electrode 38 is deposited on the ohmic contact layer 36 at the other end of the active semiconductor film 35. Thus, the source electrode 37 and the drain electrode 38 oppose each other above the gate electrode 33. Moreover, the source electrode 37 is directly connected to the source line S and the drain electrode 38 is directly deposited on the pixel electrode 32. A thin-film transistor T3 is thereby formed.

The pixel electrode 32 is formed on the gate insulating film 34 in the pixel region surrounded by the source lines S and the gate lines G. The pixel electrode 32 occupies most of the area of the pixel region and is in direct contact with one end of the drain electrode 38 and with the gate insulating film 34 at portions other than portions for forming the source electrode 37, the active semiconductor film 35, and the drain electrode 38.

Source terminals 42 of ITZO or IZO are deposited so as to partially cover both ends SE2 (only upper ends are depicted in FIG. 9) of the source lines S. Also, gate terminals 43 of ITZO or IZO are deposited so as to partially cover both ends GE2 (only left ends are depicted in FIG. 9) of the gate lines G.

In the second embodiment, the pixel electrode 32 composed of IZO or ITZO is directly formed on the gate insulating film 34 and the drain electrode 38, and the passivation film 111 shown in FIGS. 29 to 31 is not provided. Thus, steps for forming the passivation film 111 and steps for forming the contact holes 112, 108 and 113 are not necessary in this embodiment.

In the structure shown in FIGS. 9 and 12B, when the pixel electrode 32 is patterned by etching, the drain electrode 38 and the source electrode 37 are also immersed into an etching solution. An etching solution containing oxalic acid or hydrochloric acid does not damage the metallic material, which is the constituent of the drain electrode 38 and the source electrode 37, and can selectively etch the pixel electrode 32. Thus, the use of such an etching solution is preferable. In this etching process, the ends SE2 of the source line S and the ends GE2 of the gate line G are simultaneously immersed in the etching solution. The above etching solution does not damage the metallic material, which is the constituent of these ends SE2 and GE2. Thus, the source terminals 42 and the gate terminals 43 can be formed without damaging the ends SE2 of the source lines S and the ends GE2 of the gate lines G.

A method for making the thin-film transistor array substrate shown in FIGS. 9 to 12B using four masks will now be described with reference to FIGS. 10 to 12A.

Figure 10:
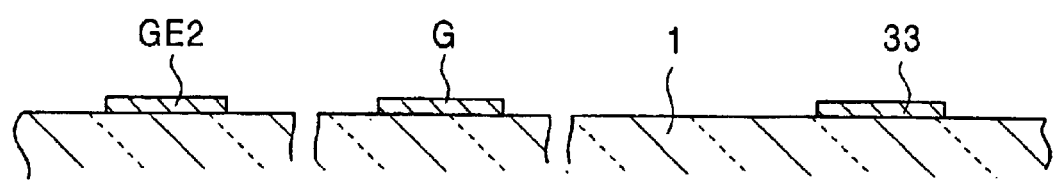
FIG. 10 is a cross-sectional view for illustrating a method for making the thin-film transistor array substrate shown in FIG. 9 in which a gate electrode and a gate line are deposited on a substrate.

With reference to FIG. 10, a metal film composed of one of the above metallic materials is formed on the transparent substrate 1 of glass etc. The metal film is patterned by a photolithographic process using a first mask to form the gate line G, the gate electrode 33, and the end GE2 of the gate line G.

Figure 11:
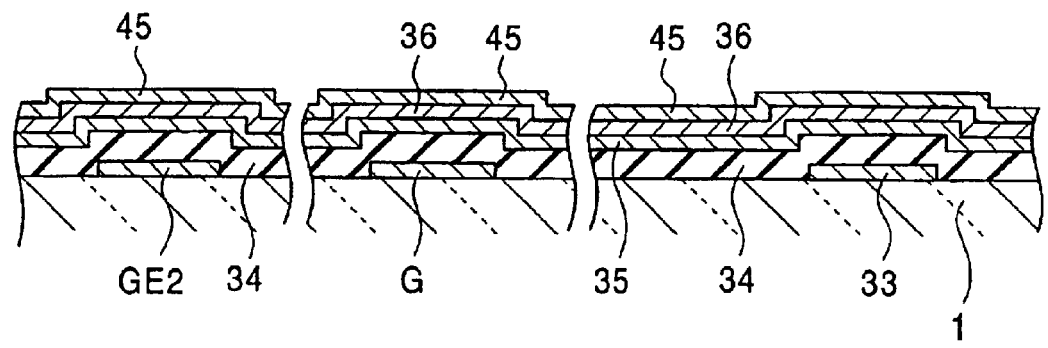
FIG. 11 is a cross-sectional view for illustrating a step subsequent to the step shown in FIG. 10 in which a gate insulating film, a semiconductive active film, and an ohmic contact film are formed on the substrate.

With reference to FIG. 11, the gate insulating film 34, the polysilicon or amorphous silicon semiconductor film 35, the ohmic contact layer 36, and a metal film 45 are deposited thereon, and are patterned by a photolithographic process using a second mask to remove all the films covering the ends of the gate line and the ends of the source line.

The metal film 45 and the ohmic contact layer 36 are patterned by a photolithographic process using a third mask to form the source electrode 37 and the drain electrode 38 which are opposingly arranged on the gate electrode 33.

With reference to FIG. 12B, an IZO or ITZO layer is deposited on the entire surface, and is patterned by a photolithographic process using a fourth mask to form the pixel electrode 32, the source terminals 42 at the ends of the source lines S, and the gate terminals 43 at the ends of the gate lines G.

The IZO layer is composed of, for example, 90% of indium oxide (InO$_x$) and 10% of zinc oxide (ZnO$_x$). A preferable etching solution for etching the IZO layer contains oxalic acid ((COOH)$_2$) or hydrochloric acid (HCl). A preferable concentration of oxalic acid in the etching solution is, for example, 0.6 mole/liter, and a preferable concentration of hydrochloric acid in the etching solution is, for example, 3.5%.

The ITZO layer is composed of, for example, 85% of indium oxide (InO$_x$), 10% of tin oxide (SnO$_x$), and 5% of zinc oxide (ZnO$_x$). The above etching solution can also be used for etching the ITZO layer.

When an oxalic acid etching solution is used in the etching process, the source line S, the source electrode 37, and the gate electrode 38 can be formed of any metal of aluminum, copper, molybdenum, chromium, titanium, tantalum, and tungsten, or any alloy thereof. When a diluted hydrochloric acid etching solution is used in the etching process, the source line S, the source electrode 37, and the gate electrode 38 can be formed of any metal of copper, molybdenum, chromium, titanium, tantalum, and tungsten. In other words, aluminum is easily eroded with the diluted hydrochloric acid solution; hence, the use of aluminum in lines and electrodes is not preferable if the diluted hydrochloric acid solution is used.

Since the ITZO layer is amorphous and exhibits high resistance after the ITZO layer is deposited, the ITZO layer is annealed at 180° C. or above after etching to decrease the resistance of the connections at the surface of the ITZO layer.

The thin-film transistor array substrate H3 having the thin-film transistor T3 shown in FIG. 12B is thereby formed. In the thin-film transistor T3, the pixel electrode 32 is directly connected to the drain electrode 38, and the source terminals 42 and the gate terminals 43 are directly connected to the source lines S and the gate lines G, respectively. Thus, this thin-film transistor substrate does not require a passivation film, which is formed on the source and drain electrodes in conventional processes. As a result, the manufacturing process does not require a step for forming the passivation film and steps for forming contact holes in the passivation film including an exposure step, a dry etching step, a stripping step, and a cleaning step. Thus, the thin-film transistor substrate can be produced via a reduced number of manufacturing steps.

Third Embodiment

Figure 13:
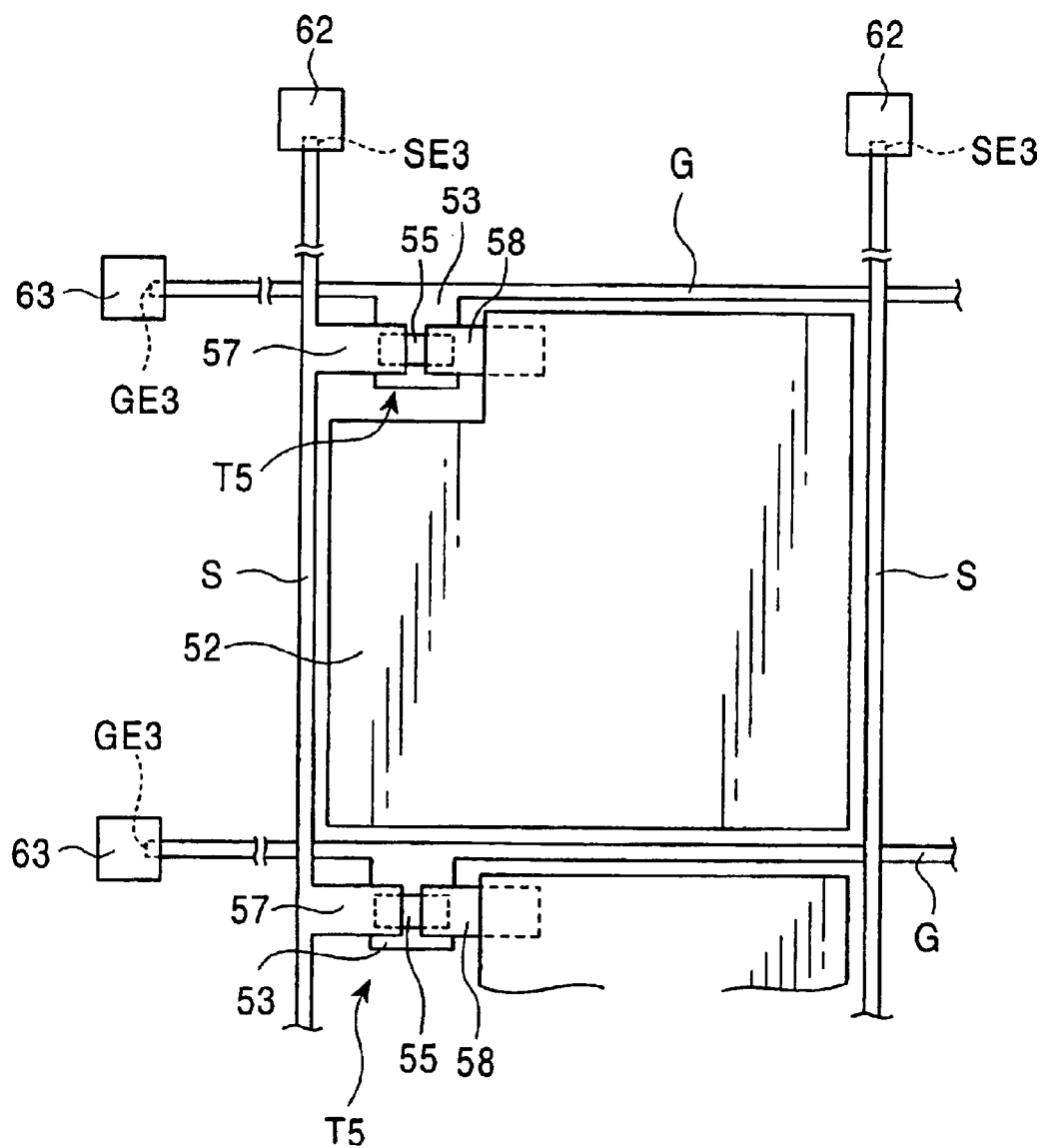
FIG. 13 is a schematic plan view of a thin-film transistor array substrate in accordance with a third embodiment.
Figure 19:
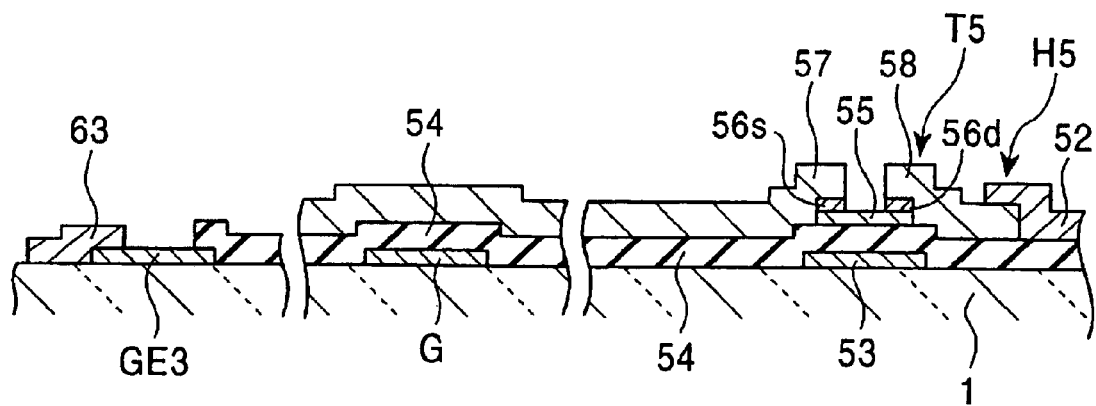
FIG. 19 is a cross-sectional view for illustrating a method for making the thin-film transistor array substrate shown in FIG. 13 in which the thin-film transistor having a pixel electrode and a terminal is formed.

FIG. 13 is a schematic plan view of a thin-film transistor array substrate H5 having a thin-film transistor T5 in accordance with a third embodiment of the present invention, and FIG. 19 is a cross-sectional view of the main section of a thin-film transistor section. When a liquid crystal display is formed using the thin-film transistor array substrate H5 having the thin-film transistor section shown in FIG. 19, the thin-film transistor array substrate H5 is used together with a counter substrate (not shown in the drawing), and a liquid crystal is enclosed between these two substrates, as in the first embodiment.

In the thin-film transistor array substrate H5, a plurality of gate lines G and source lines S are formed in a matrix on a transparent substrate 1 composed of glass etc. Regions surrounded by the gate lines G and the source lines S constitute pixel regions. A pixel electrode 52 composed of a transparent conductive material, e.g., ITZO (indium tin zinc oxide) or IZO (indium zinc oxide), is provided above the transparent substrate 1 in each pixel region. A thin-film transistor T5 is provided at a corner of each pixel region.

With reference to FIG. 13, a rectangular gate electrode 53 is extracted from a gate line G at a corner for forming a thin-film transistor of each pixel region on the transparent substrate. With reference to FIG. 19, a gate insulating film 54 is formed to cover the gate line G and the gate electrode 53. An island of an active semiconductor film 55 composed of polysilicon or amorphous silicon (a-Si) is formed on the gate insulating film 54 above the gate electrode 53. An ohmic contact layer 56 composed of amorphous silicon doped with an n-type dopant such as phosphorus (a-Si:n$^+$) is deposited thereon. A source electrode 57 is deposited on the ohmic contact layer 56 at one end of the active semiconductor film 55, whereas a drain electrode 58 is deposited on the-ohmic contact layer 56 at the other end of the active semiconductor film 55. Thus, the source electrode 57 and the drain electrode 58 oppose each other above the gate electrode 53. Moreover, the source electrode 57 is directly connected to a source line S and the drain electrode 58 is directly deposited on the pixel electrode 52. A thin-film transistor T5 is thereby formed.

The pixel electrode 52 is formed on the gate insulating film 54 in the pixel region surrounded by the source lines S and the gate lines G. The pixel electrode 52 occupies most of the area of the pixel region and is in direct contact with one end of the drain electrode 58 and with the gate insulating film 54 at portions other than portions for forming the source electrode 57, the active semiconductor film 55, and the drain electrode 58.

Source terminals 62 of ITZO or IZO are deposited so as to partially cover both ends SE3 (only upper ends are depicted in FIG. 13) of the source lines S. Also, gate terminals 63 of ITZO or IZO are deposited on the substrate 1 so as to partially cover both ends GE3 (only left ends are depicted in FIG. 13) of the gate lines G.

In the third embodiment, the pixel electrode 52 composed of IZO or ITZO is directly formed on the gate insulating film 54 and the drain electrode 58, and a passivation film 111 shown in FIGS. 29 to 31 is not provided. Thus, steps for forming the passivation film 111 and steps for forming the contact holes 112, 108 and 113 are not necessary in this embodiment.

In the structure shown in FIGS. 13 and 19, when the pixel electrode 52 is patterned by etching, the drain electrode 58 and the source electrode 57 are also immersed into an etching solution. An etching solution containing oxalic acid or hydrochloric acid does not damage the metallic material, which is the constituent of the drain electrode 58 and the source electrode 57, and can selectively etch the pixel electrode 52. Thus, the use of such an etching solution is preferable. In this etching process, the end SE3 of the source line S and the end GE3 of the gate line G are simultaneously immersed in the etching solution. The above etching solution does not damage the metallic material, which is the constituent of these ends SE2 and GE2. Thus, the source terminals 62 and the gate terminals 63 can be formed without damages of the end SE3 of the source line S and the end GE3 of the gate line G.

A method for making the thin-film transistor array substrate shown in FIGS. 13 to 19 using five masks will now be described with reference to FIGS. 14 to 18.

Figure 14:
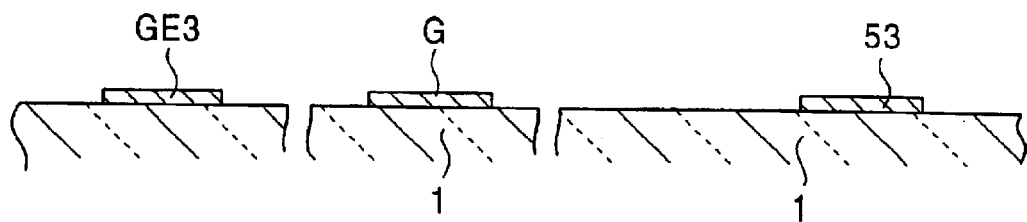
FIG. 14 is a cross-sectional view for illustrating a method for making the thin-film transistor array substrate shown in FIG. 13 in which a gate electrode and a gate line are deposited on a substrate.

With reference to FIG. 14, a metal film composed of one of the above metallic materials is formed on the transparent substrate 1 of glass etc. The metal film is patterned by a photolithographic process using a first mask to form the gate line G, the gate electrode 53, and the end GE3 of the gate line G.

Figure 15:
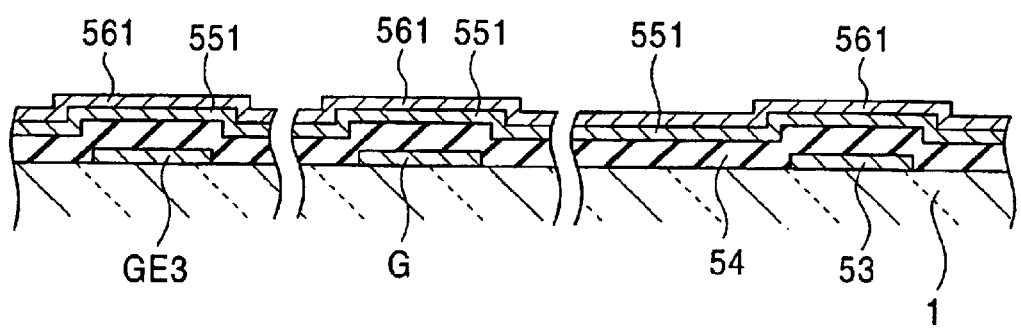
FIG. 15 is a cross-sectional view for illustrating a step subsequent to the step shown in FIG. 14 in which a gate insulating film and a semiconductive active film are deposited on a substrate.
Figure 16:
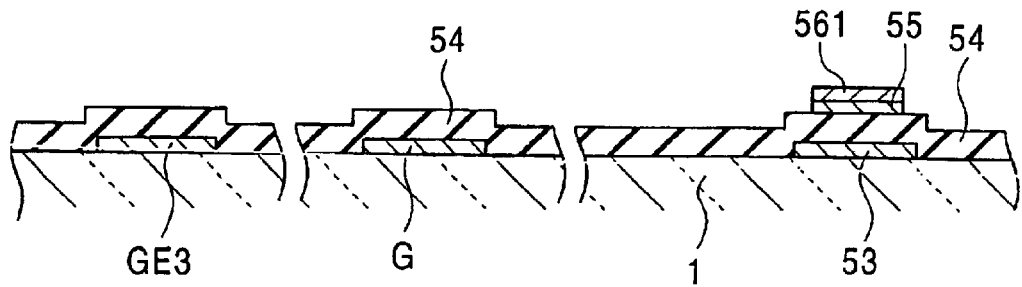
FIG. 16 is a cross-sectional view for illustrating a step subsequent to the step shown in FIG. 15 in which an island of an ohmic contact film and a semiconductive active film is formed on the gate insulating film at a position above the gate electrode on the substrate.

With reference to FIG. 15, the gate insulating film 54, a polysilicon or amorphous silicon active semiconductor film 551 and an ohmic contact layer 561 are deposited thereon. With reference to FIG. 16, the active semiconductor film 551 and the ohmic contact layer 561 are patterned by a photolithographic process using a second mask so that these layers remain as an island of the active semiconductor film 55 and the ohmic contact layer 56 on the gate insulating film 54 only at a position above the gate electrode 53.

Figure 17:
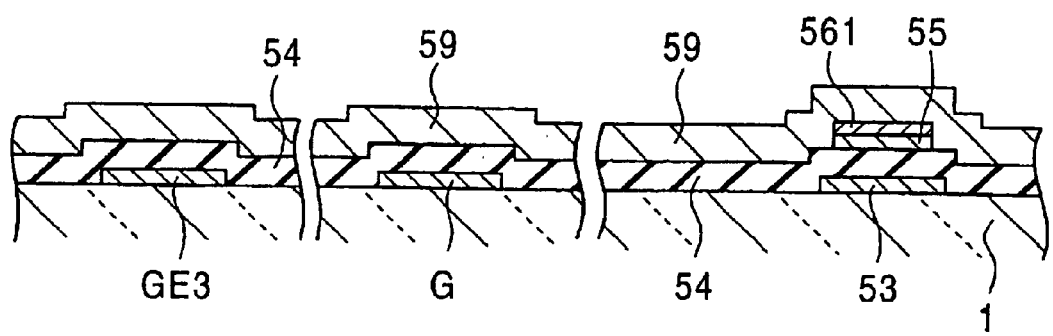
FIG. 17 is a cross-sectional view for illustrating a step subsequent to the step shown in FIG. 16 in which an electrode film is formed over the ohmic contact layer and the semiconductive active film.
Figure 18:
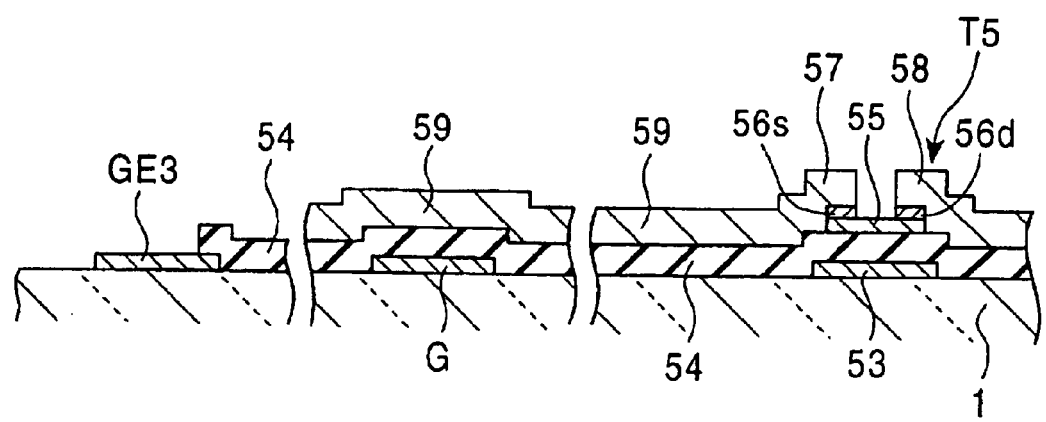
FIG. 18 is a cross-sectional view for illustrating a step subsequent to the step shown in FIG. 17 in which a thin-film transistor is formed above the gate electrode.

With reference to FIG. 17, a metal film 59 is deposited thereon. With reference to FIG. 18, the metal film 59 and the ohmic contact layer 56 are patterned by a photolithographic process using a third mask to form the source electrode 57 on the left ohmic contact layer 56s on one side (left side) of the active semiconductor film 55 and to form the drain electrode 57 on the right ohmic contact layer 56d on the other side (right side) of the active semiconductor film 55. Next, the gate insulating film 54 on the end GE3 of the gate line G, the end SE3 of the source line S, and the peripheries thereof is removed by a photolithographic process using a fourth mask.

Figure 20:
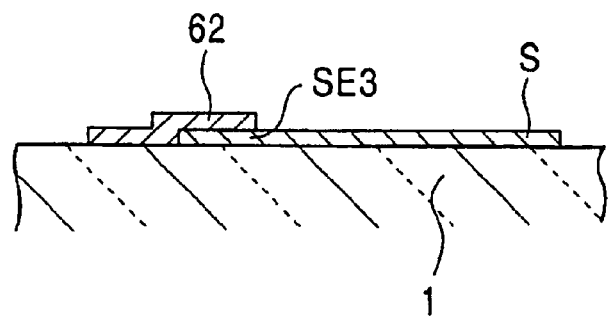
FIG. 20 is a cross-sectional view of a source line terminal of the thin-film transistor shown in FIG. 19.

With reference to FIGS. 19 and 20, an IZO or ITZO layer is deposited on the entire surface, and is patterned by a photolithographic process using a fifth mask to form the pixel electrode 52, the source terminals 62 at the end SE3 of the source line S (FIG. 20), and the gate terminals 63 at the end SE3 of the gate line G (FIG. 19).

The IZO layer is composed of, for example, 90% of indium oxide (InO$_x$) and 10% of zinc oxide (ZnO$_x$). A preferable etching solution for etching the IZO layer contains oxalic acid ((COOH)$_2$) or hydrochloric acid (HCl). A preferable concentration of oxalic acid in the etching solution is, for example, 0.6 mole/liter, and a preferable concentration of hydrochloric acid in the etching solution is, for example, 3.5%.

The ITZO layer is composed of, for example, 85% of indium oxide (InO$_x$), 10% of tin oxide (SnO$_x$), and 5% of zinc oxide (ZnO$_x$). The above etching solution can also be used for etching the ITZO layer.

When an oxalic acid etching solution is used in the etching process, the source line S, the source electrode 57, and the gate electrode 58 can be formed of any metal of aluminum, copper, molybdenum, chromium, titanium, tantalum, and tungsten, or any alloy thereof. When a diluted hydrochloric acid etching solution is used in the etching process, the source line S, the source electrode 57, and the gate electrode 58 can be formed of any metal of copper, molybdenum, chromium, titanium, tantalum, and tungsten. In other words, aluminum is easily eroded with the diluted hydrochloric acid solution; hence, the use of aluminum in lines and electrodes is not preferable if the diluted hydrochloric acid solution is used.

Since the ITZO layer is amorphous and exhibits high resistance after the ITZO layer is deposited, the ITZO layer is annealed at 180° C. or above after etching to decrease resistance of the connections at the surface of the ITZO layer.

The thin-film transistor array substrate H5 having the thin-film transistor T5 shown in FIG. 19 is thereby formed. In the thin-film transistor T5, the pixel electrode 52 is directly connected to the drain electrode 58, and the source terminals 62 and the gate terminals 63 are directly connected to the source line S and the gate line G, respectively. Thus, this thin-film transistor substrate does not require a passivation film, which is formed on the source and drain electrodes in conventional processes. As a result, the manufacturing process does not require a step for forming the passivation film and steps for forming contact holes in the passivation film including an exposure step, a dry etching step, a stripping step, and a cleaning step. Thus, the thin-film transistor substrate can be produced via a reduced number of manufacturing steps.

EXAMPLES

An indium tin oxide (ITO) film composed of 92 atomic percent of indium and 8 atomic percent of tin with a thickness of 1,200 Å was formed on a glass substrate by a sputtering process using a target composed of 90 atomic percent of indium and 10 atomic percent of tin. An indium tin zinc oxide (ITZO) film composed of 88 atomic percent of indium, 9 atomic percent of tin, and 3 atomic percent of zinc with a thickness of 1,200 Å was also formed on a glass substrate by a sputtering process using a target composed of 85 atomic percent of indium, 10 atomic percent of tin, and 5 atomic percent of zinc. Moreover, an indium zinc oxide (IZO) film composed of 82 atomic percent of indium and 18 atomic percent of zinc with a thickness of 1,200 Å was formed on a glass substrate by a sputtering process using a target composed of 83 atomic percent of indium and 17 atomic percent of zinc. In each sputtering process, the deposition temperature was room temperature, and the oxygen partial pressure was $6.3 \times 10^{-3}$ Pa ($5 \times 10^{-5}$ Torr).

Figure 21:
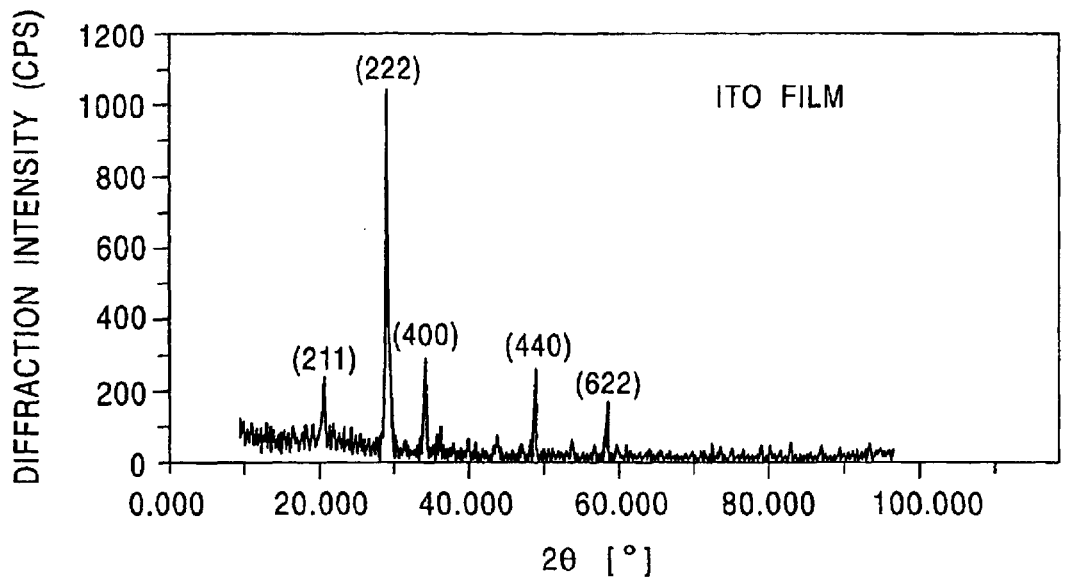
FIG. 21 is an X-ray diffraction pattern of an ITO film.
Figure 22:
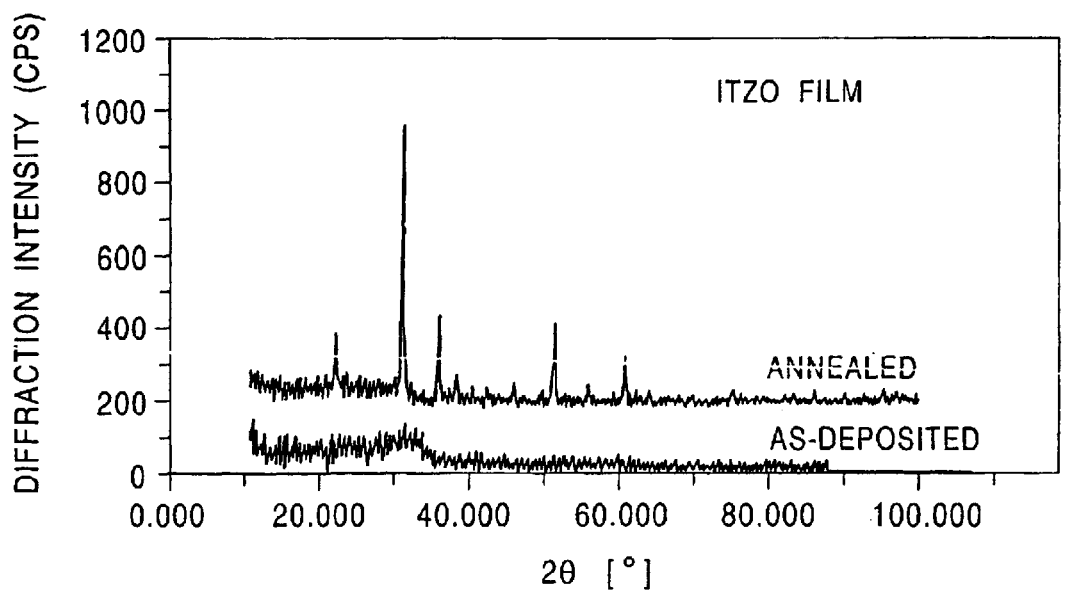
FIG. 22 is an X-ray diffraction pattern of an ITZO film.
Figure 23:
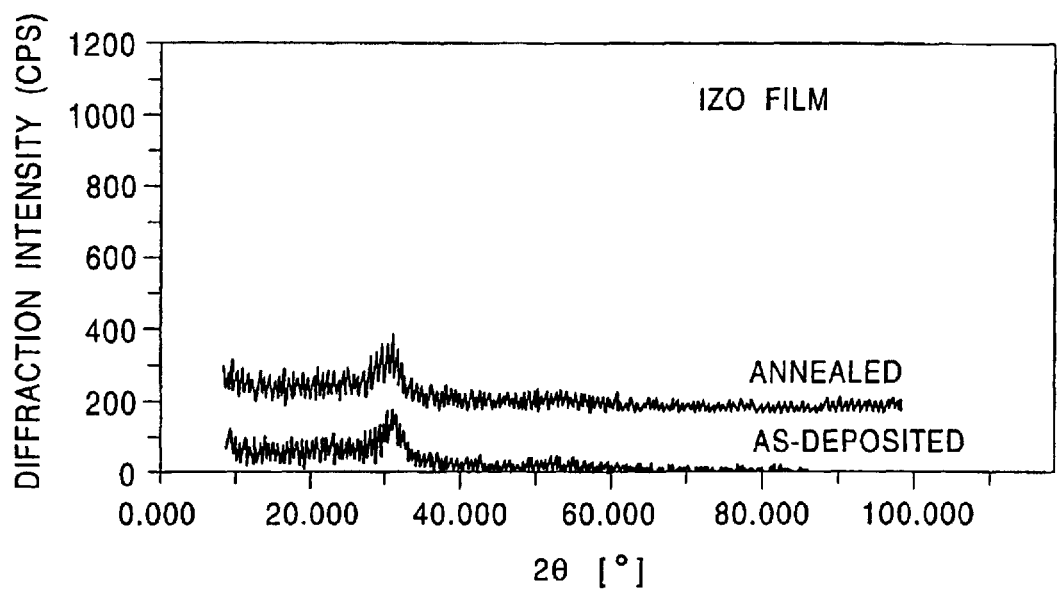
FIG. 23 is an X-ray diffraction pattern of an IZO film.

The IZO film and the ITZO film were annealed in an annealing oven of a 20%-$H_2$/$N_2$ atmosphere at 250° C. for 2 hours and was subjected to X-ray diffractometry. FIG. 21 is an X-ray diffraction pattern of the ITO film, FIG. 22 is an X-ray diffraction pattern of the ITZO film, and FIG. 23 is an X-ray diffraction pattern of the IZO film.

These X-ray diffraction patterns suggest that the ITO film deposited at room temperature is crystalline whereas the ITZO film and the IZO film deposited at room temperature are amorphous. Moreover, the ITZO film is crystallized by annealing whereas the IZO film is not crystallized by annealing.

These results show that the ITZO film in accordance with the present invention is amorphous in an as-deposited state and can be crystallized by annealing.

The resistance of the ITZO film is $600 \times 10^{-6}$ Ω·cm in the amorphous state and decreases to $250 \times 10^{-6}$ Ω·cm in the annealed state by crystallization.

Figure 24:
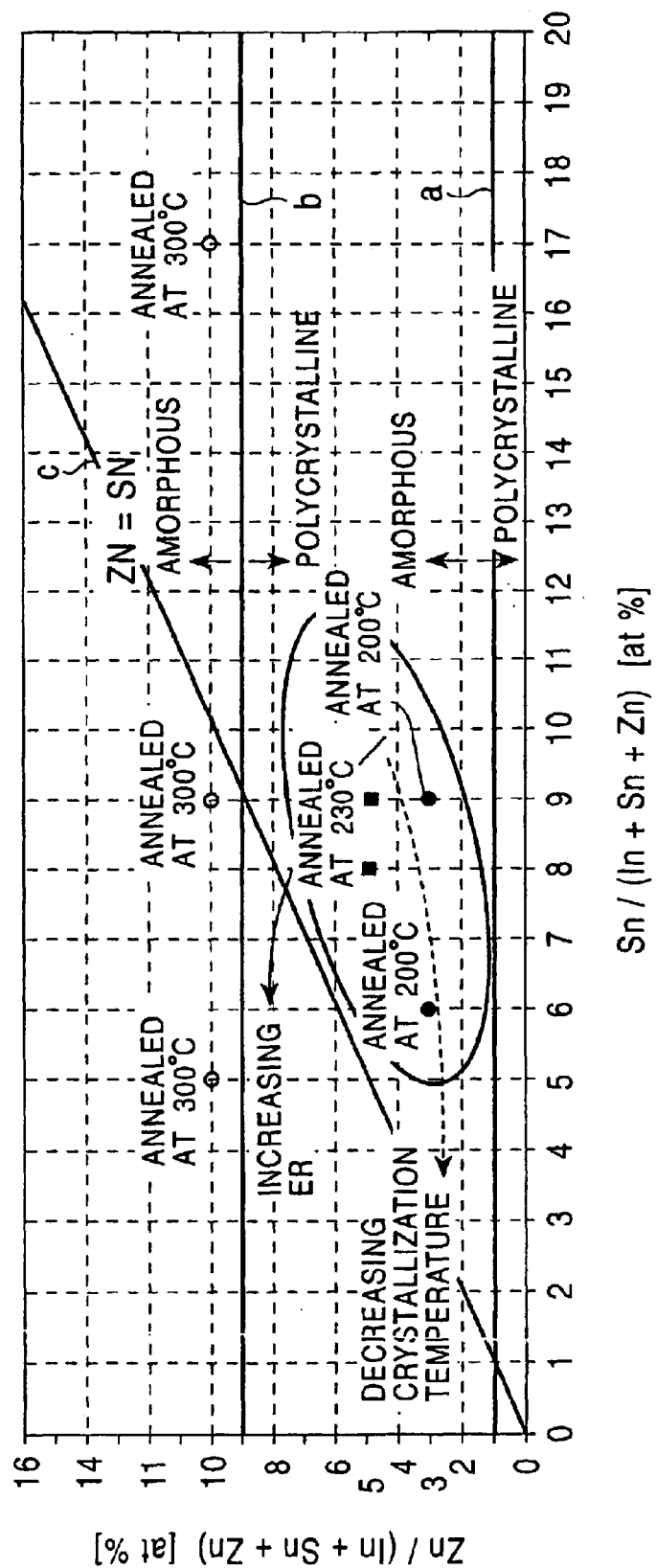
FIG. 24 is a graph of the relationship between the structure (amorphous or crystalline) of a transparent oxide film in accordance with the present invention and the zinc and tin contents.

FIG. 24 is a graph which exhibit whether the annealed ITZO film in accordance with the present invention is amorphous or polycrystalline. The ordinate of the graph represents the zinc content by atomic percent with respect to the total amount of indium, tin, and zinc, whereas the abscissa represent the tin content by atomic percent with respect to the total amount of indium, tin, and zinc. Line a in FIG. 24 indicates 1 atomic percent of zinc, line b indicates 9 atomic percent of zinc, and line c indicates that the atomic ratio of tin to zinc is 1.

In a region below line a, the deposited transparent oxide film is polycrystalline and thus is not easily etched in a weakly acidic solution. In a region above line b, the deposited film is amorphous and the amorphous state does not change by annealing. Thus, the contact resistance cannot be decreased by annealing in this region. Since line c indicates that the zinc content and the tin content are the same, zinc consuming electron carriers is excessively present in a region above line c. Thus, the contact resistance is high in this region. In a region below line c, the resistance increases towards line c.

In FIG. 24, a film containing 10 atomic percent of zinc and 5 atomic percent of tin and a film containing 10 atomic percent of zinc and 9 atomic percent of tin are not crystallized by annealing at 300° C. In contrast, a film containing 5 atomic percent of zinc and 8 atomic percent of tin and a film containing 5 atomic percent of zinc and 9 atomic percent of tin are crystallized by annealing at 230° C. Moreover, a film containing 3 atomic percent of zinc and 6 atomic percent of tin and a film containing 3 atomic percent of zinc and 9 atomic percent of tin are crystallized by annealing at 200° C.

These results show that a lower zinc content facilitates crystallization at a lower annealing temperature. When the transparent oxide film in accordance with the present invention is applied to an electronic device, the annealing temperature is preferably as low as possible in view of the withstand temperature of the substrate and various films which are deposited thereon. Thus, the zinc content and the tin content with respect to indium are preferably as low as possible in order to decrease the annealing temperature and contact resistance.

In a more preferable embodiment, the atomic ratio of tin to zinc is higher than 1, the zinc content is in a range of 2 atomic percent to 7 atomic percent, and the tin content is in a range of 5 atomic percent to 10 atomic percent.

Figure 25:
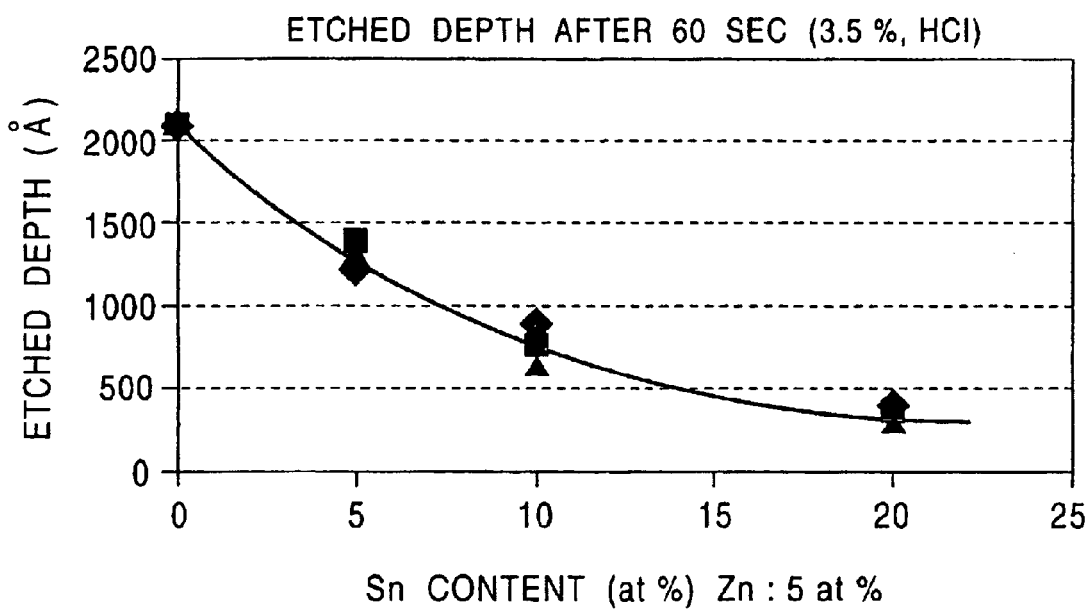
FIG. 25 is a graph of the relationship between the etched depth of a transparent oxide film in accordance with the present invention and the tin content.

FIG. 25 is a graph showing the etched depth when the as-deposited ITZO film is etched for 60 seconds in a 3.5% hydrochloric acid solution (weakly acidic solution) in which the zinc content is fixed to 5 atomic percent while the tin content is varied.

As shown in FIG. 25, the etched depth decreases as the tin content increases. Thus, the etching rate (E/R) can be appropriately determined by controlling the tin content when the transparent oxide film is micropatterned. Since the etched depth is small at a tin content of 20 atomic percent or more, the upper limit of the tin content is set to be 20 atomic percent.

Figure 26:
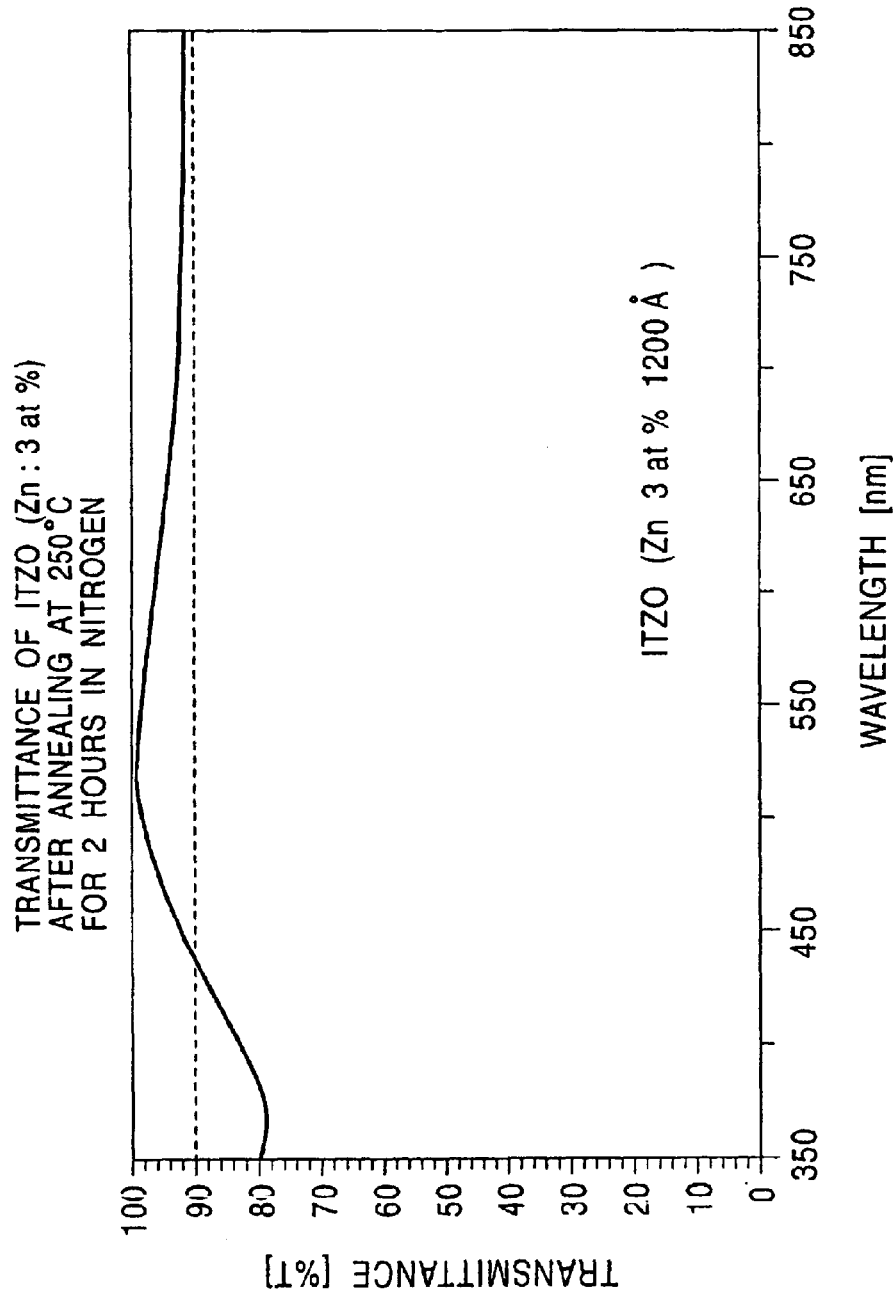
FIG. 26 is a graph of the relationship between the light transmittance of a transparent oxide film in accordance with the present invention and the wavelength.

FIG. 26 is a graph showing the dependence of the light transmittance of the as-deposited transparent ITZO film on the wavelength when the zinc content is 3 atomic percent and the tin content is 9 atomic percent. The transparent oxide film in accordance with the present invention exhibits a high light transmittance exceeding 90% in a visible light region (approximately 450 to 750 nm). This light transmittance is substantially equal to or larger than that of a conventional indium tin oxide film in a specific wavelength range. When the transparent oxide film in accordance with the present invention is used as pixel electrodes and transparent lines of a liquid crystal panel, the displayed image is bright.

Figure 27:
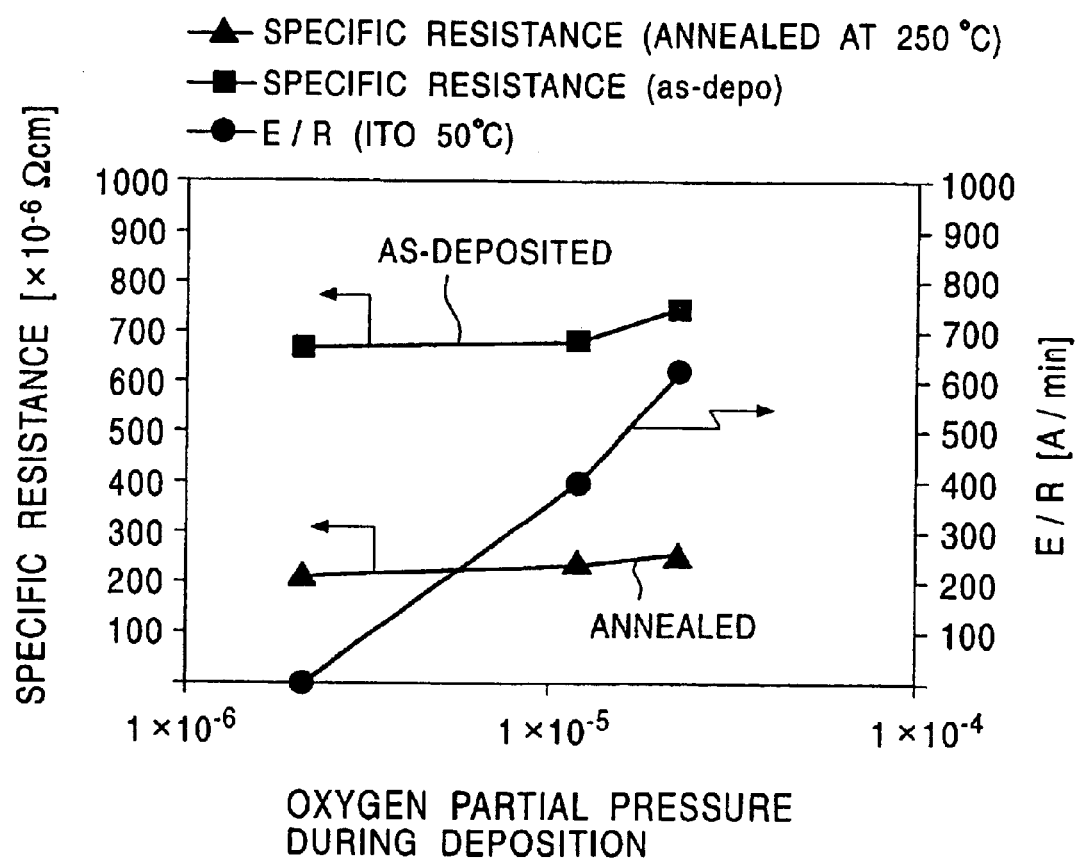
FIG. 27 is a graph of the relationships between the specific resistance of a transparent oxide film in accordance with the present invention and the oxygen partial pressure in the deposition process and between the etching rate of an ITO film and the oxygen partial pressure.

FIG. 27 is a graph showing the dependence of the specific resistance of the as-deposited film and the annealed film having the above composition on the oxygen partial pressure in the deposition atmosphere and the dependence of the etching rate (E/R) of the amorphous ITO film on the oxygen partial pressure. An amorphous ITO (a-ITO) film having a low etching rate can be formed by precisely controlling the oxygen partial pressure. However, a slight change in oxygen partial pressure causes the formation of an a-ITO film having different etching rates (E/R) at different positions. Thus, the uniformity of etching is low in the deposition of the a-ITO film, and it is difficult to form a micropattern of lead lines from the a-ITO film.

Figure 28:
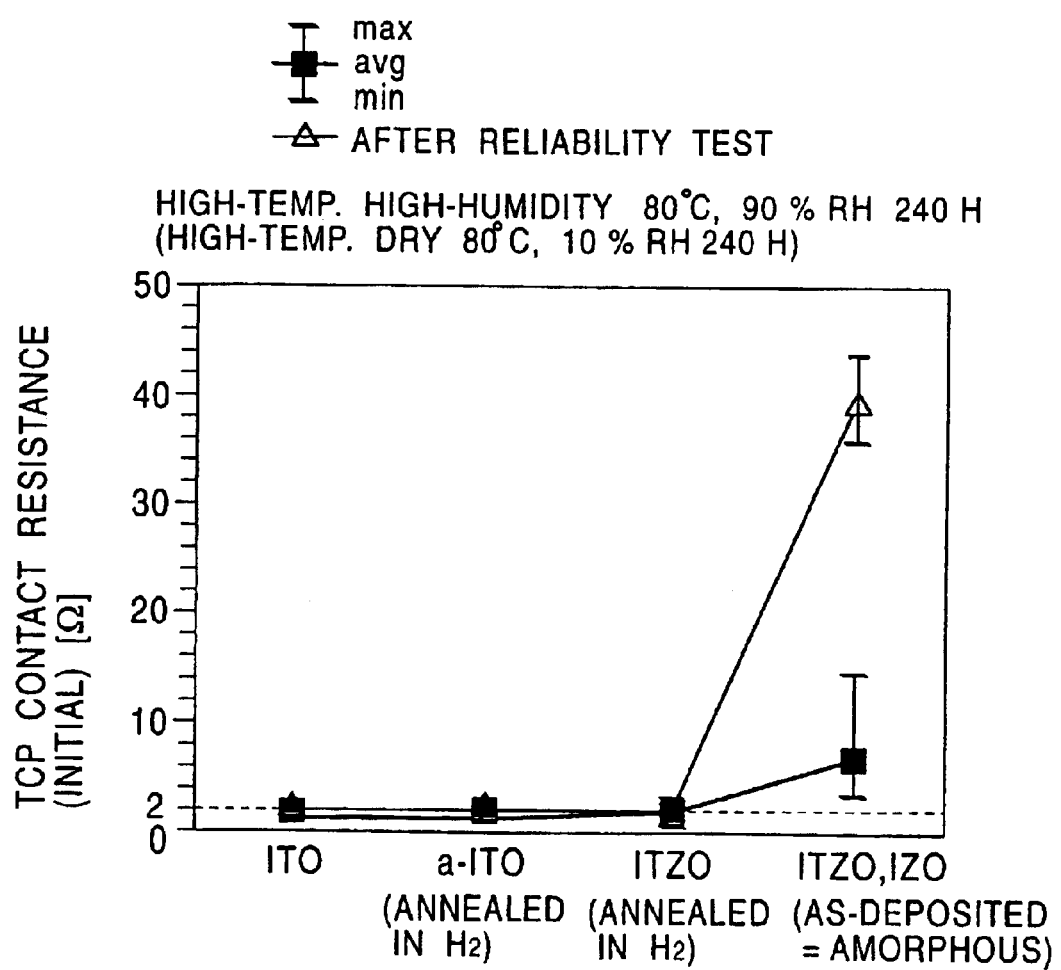
FIG. 28 is a graph of results of a reliability test of the TCP contact resistance of a transparent oxide film in accordance with the present invention.

FIG. 28 is a graph of reliability tests of TCP connection. The data of resistance of each sample is shown in Table 1. The TCP resistance in Table 1 indicates the average of the resistances at 50 TCP connections between the metal terminal and the film in which each resistance is measured between any two lines (connection with metal terminal electrodes having a width of 40 μm and an interval of 40 μm). The resistance after reliability test indicates the resistance after the TCP connection is subjected to a high-temperature high-humidity environment (80° C., 90% RH) for 240 hours.

TABLE 1

| Film | H$_2$ Annealing | Film Structure | Initial TCP Resistance | Resistance after Reliability Test |
|---|---|---|---|---|
| ITO | Not annealed | Polycrystalline | 1.1 Ω | 1.9 Ω |
| a-ITO | Annealed | Polycrystalline | 1.4 Ω | 2.0 Ω |
| ITZO | Annealed | Polycrystalline | 3.7 Ω | 2.3 Ω |
| IZO | Not annealed | Amorphous | 7.4 Ω | 41.3 Ω |
| ITZO | Not annealed | Amorphous | (7.4 Ω) | (41.3 Ω) |

The results in Table 2 show that both the IZO film and the a-ITO film exhibits increased contact resistances in the atmosphere over time. The a-ITO film is crystallized by annealing and the contact resistance is maintained at a low level after the reliability test. According to X-ray diffractometry (not shown in Table 1), the annealed IZO film is amorphous, and the contact resistance is not improved to that of the ITO film.

The results of another reliability test in a high-temperature dry environment at 80° C. and 10% RH for 240 hours are substantially the same as the results shown in FIG. 28.

These results suggest that the resistance of the amorphous ITZO can be decreased by annealing and can be maintained after the environmental test.

What is claimed is:

1. A thin-film transistor substrate comprising a source line and a source terminal, the source terminal including one of indium tin zinc oxide and indium zinc oxide and being a different layer than the source line, wherein at least a portion of the source terminal is directly connected to at least two sides of the source line, and the source line is connected with thin-film transistors, which are disposed in a region distinct from a region containing the source terminal.

2. A thin-film transistor substrate according to claim 1, wherein the source line comprises any on selected from the group consisting of aluminum, copper, molybdenum, chromium, titanium, tantalum, tungsten, and alloys thereof.

3. A thin-film transistor substrate comprising: a substrate which is insulating at least at the surface thereof; a plurality of gate lines and source lines in a matrix formed on the substrate; pixel electrodes provided in regions surrounded by the gate lines and the source lines; and thin-film transistors, each being connected to the corresponding pixel electrode, the corresponding gate line, and the corresponding source line and functioning as a switching element for the corresponding pixel electrode; wherein each gate line is directly connected to a gate terminal comprising one of indium tin zinc oxide and indium zinc oxide, the gate lines and gate terminals are different layers and at least a portion of the gate line is directly connected to the gate terminal, each source line is directly connected to a source terminal comprising one of indium tin zinc oxide and indium zinc oxide, the source lines and source terminals are different layers and at least a portion of the source terminal is directly connected to at least two sides of the source terminal line; the pixel electrodes comprise one of indium tin zinc oxide and indium zinc oxide, and a drain electrode of each thin-film transistor is directly connected to the corresponding pixel electrode, the drain electrodes and pixel electrodes are different layers and at least a portion of each of the drain electrodes is directly connected to each of the pixel electrodes.

4. A liquid crystal display comprising a pair of substrates and a liquid crystal held between the pair of substrates, one of the pair of substrates being a thin-film transistor substrate according to claim 1.

5. A liquid crystal display comprising a pair of substrates and a liquid crystal held between the pair of substrates, one of the pair of substrates being a thin-film transistor substrate according to claim 3.

* * * * *

UNITED STATES PATENT AND TRADEMARK OFFICE
CERTIFICATE OF CORRECTION

PATENT NO.    : 6,852,998 B2    Page 1 of 1
DATED         : February 8, 2005
INVENTOR(S)   : Chae Gee Sung et al.

It is certified that error appears in the above-identified patent and that said Letters Patent is hereby corrected as shown below:

Column 18,
Line 11, before "selected from" delete "on" and substitute -- one -- in its place.

Signed and Sealed this

Twenty-fourth Day of May, 2005

JON W. DUDAS
*Director of the United States Patent and Trademark Office*